(12) United States Patent
Wen et al.

(10) Patent No.: US 10,319,581 B1
(45) Date of Patent: Jun. 11, 2019

(54) CUT METAL GATE PROCESS FOR REDUCING TRANSISTOR SPACING

(71) Applicant: Taiwan Semiconductor Manufacturing Co., Ltd., Hsinchu (TW)

(72) Inventors: Ming-Chang Wen, Kaohsiung (TW); Chang-Yun Chang, Taipei (TW); Hsien-Chin Lin, Hsinchu (TW); Hung-Kai Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/827,709

(22) Filed: Nov. 30, 2017

(51) Int. Cl.
| | |
|---|---|
| *H01L 21/02* | (2006.01) |
| *H01L 21/3215* | (2006.01) |
| *H01L 21/3105* | (2006.01) |
| *H01L 29/06* | (2006.01) |
| *H01L 29/66* | (2006.01) |
| *H01L 21/762* | (2006.01) |
| *H01L 29/78* | (2006.01) |
| *H01L 21/8258* | (2006.01) |

(52) U.S. Cl.
CPC .... *H01L 21/0214* (2013.01); *H01L 21/02164* (2013.01); *H01L 21/31056* (2013.01); *H01L 21/32155* (2013.01); *H01L 21/76224* (2013.01); *H01L 21/8258* (2013.01); *H01L 29/0649* (2013.01); *H01L 29/66545* (2013.01); *H01L 29/7848* (2013.01)

(58) Field of Classification Search
CPC ............ H01L 21/0214; H01L 21/8258; H01L 29/7848; H01L 21/76224; H01L 29/66545; H01L 21/02164; H01L 21/31056; H01L 21/32155; H01L 29/0649
See application file for complete search history.

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 8,860,148 | B2 | 10/2014 | Hu et al. |
| 8,962,400 | B2 | 2/2015 | Tsai et al. |
| 9,093,514 | B2 | 7/2015 | Tsai et al. |
| 9,105,490 | B2 | 8/2015 | Wang et al. |
| 9,236,267 | B2 | 1/2016 | De et al. |
| 9,236,300 | B2 | 1/2016 | Liaw |
| 9,245,805 | B2 | 1/2016 | Yeh et al. |

(Continued)

*Primary Examiner* — Karen Kusumakar
(74) *Attorney, Agent, or Firm* — Haynes and Boone, LLP

(57) ABSTRACT

A method includes providing a structure having a substrate and first and second fins over the substrate and oriented lengthwise generally along a first direction; epitaxially growing semiconductor source/drain (S/D) features over the first and second fins, wherein a first semiconductor S/D feature over the first fin merges with a second semiconductor S/D feature over the second fin; and performing a first etching process to an area between the first and second fins, wherein the first etching process separates the first and second semiconductor S/D features.

20 Claims, 20 Drawing Sheets

(56) References Cited

U.S. PATENT DOCUMENTS

| | | |
|---|---|---|
| 9,520,482 B1 | 12/2016 | Chang et al. |
| 9,576,814 B2 | 2/2017 | Wu et al. |
| 2014/0134814 A1* | 5/2014 | Wong .............. H01L 21/823418 438/283 |
| 2017/0148914 A1* | 5/2017 | Lee ....................... H01L 27/092 |
| 2018/0308952 A1* | 10/2018 | Adusumilli ........... H01L 29/665 |

* cited by examiner

CUT METAL GATE PROCESS FOR REDUCING TRANSISTOR SPACING

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, when designing and manufacturing SRAM (static random access memory) cells having pull-up (PU) devices, pull-down (PD) devices, and pass-gate (PG) devices, it is common to form PU devices (e.g., PMOS) in one device region (e.g., in an n-well), and form PD and PG devices in another device region (e.g., in a p-well). However, at least for the PU devices, there is a concern that the spacing among them needs to be sufficiently large so that epitaxial source/drain (S/D) features of the PU devices do not merge to cause short defects. On the one hand, having large epitaxial S/D features are generally desirable for reducing S/D contact resistance. On the other hand, having large epitaxial S/D features also increases the spacing requirements among the PU devices, thereby undesirably reducing device integration. An object of the present disclosure seeks to resolve this issue, among others.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
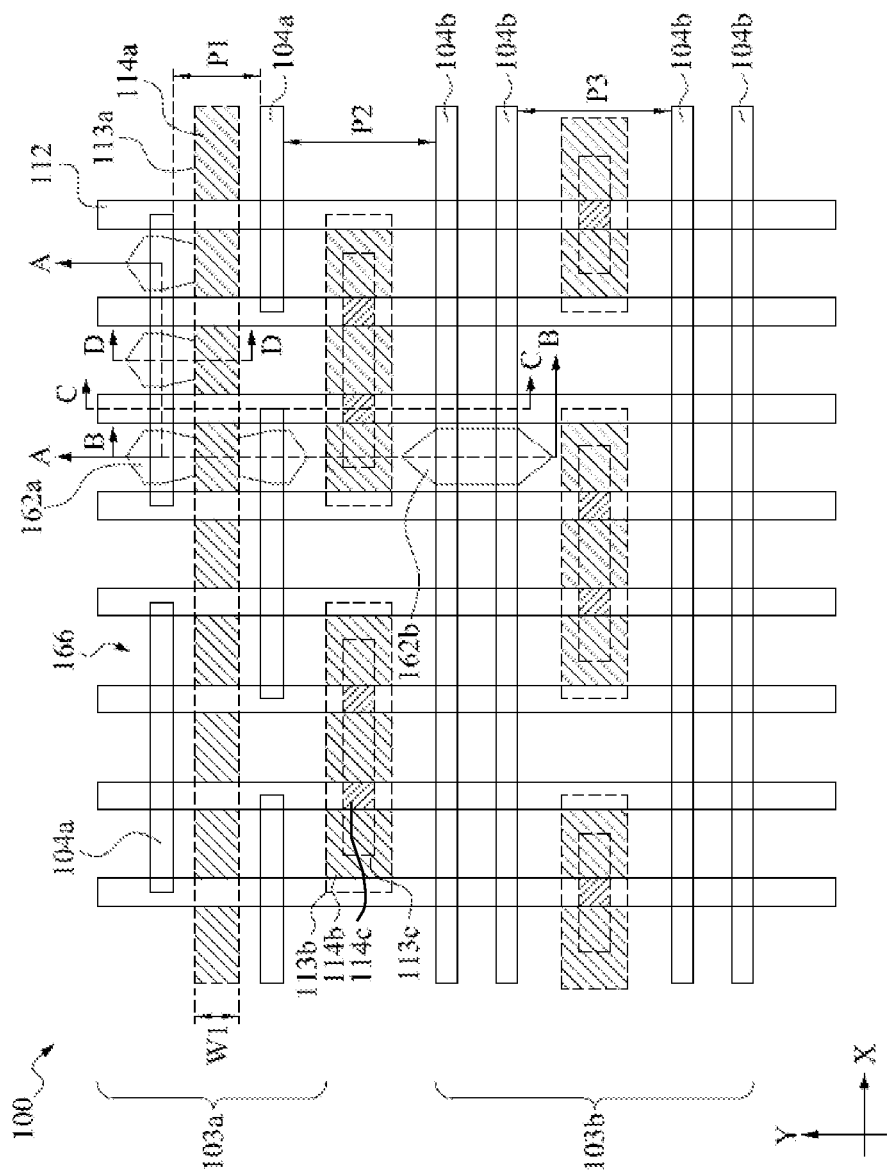
FIG. 1A shows a top view of a semiconductor structure implemented with a cut metal gate process, according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and fabrication methods, and more particularly to fabricating FinFET semiconductor devices using a cut metal gate process that beneficially reduces the spacing requirements between adjacent fins such as fins for forming p-type FinFETs. A cut metal gate (CMG) process refers to a fabrication process where after a metal gate (e.g., a high-k metal gate or HK MG) replaces a dummy gate structure (e.g., a polysilicon gate), the metal gate is cut (e.g., by an etching process) to separate the metal gate into two or more portions. Each portion functions as a metal gate for an individual transistor. An isolation material is subsequently filled into trenches between adjacent portions of the metal gate. These trenches are referred to as cut metal gate trenches, or CMG trenches, in the present disclosure. A CMG process according to the present disclosure includes two exposure steps and two etching steps (so-called 2P2E). The first exposure step and the first etching step are designed for etching dielectric layers and those merged epitaxial S/D features that need to be separated, without etching the metal gates. The second exposure step and the second etching step are designed for etching the metal gates. By utilizing this 2P2E process, semiconductor fins can be arranged closer and epitaxial S/D features can be grown larger than traditional devices. This simultaneously serves two purposes: increasing device integration by reducing spacing between semiconductor fins, and growing large epitaxial S/D features for reducing S/D contact resistance.

Figure 1B:
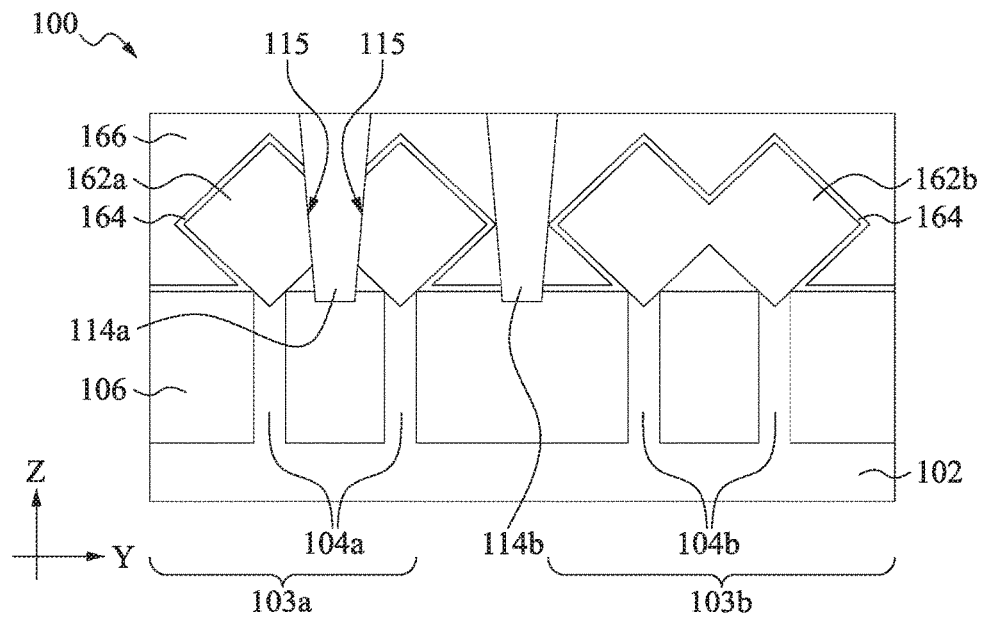
FIGS. 1B, 1C, and 1D show cross-sectional views of the structure in FIG. 1A, in accordance with some embodiments.
Figure 1C:
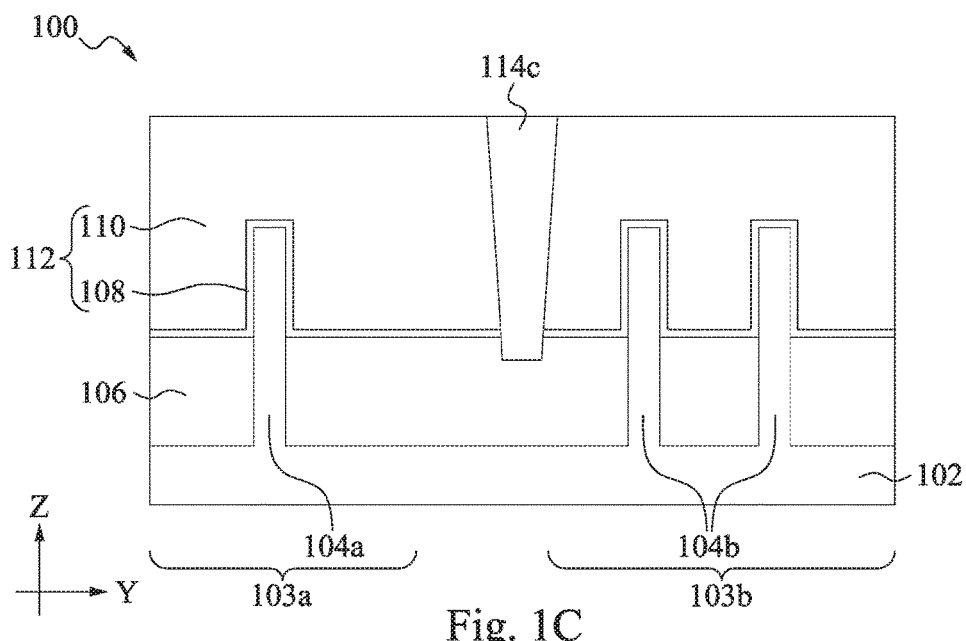
Figure 1D:
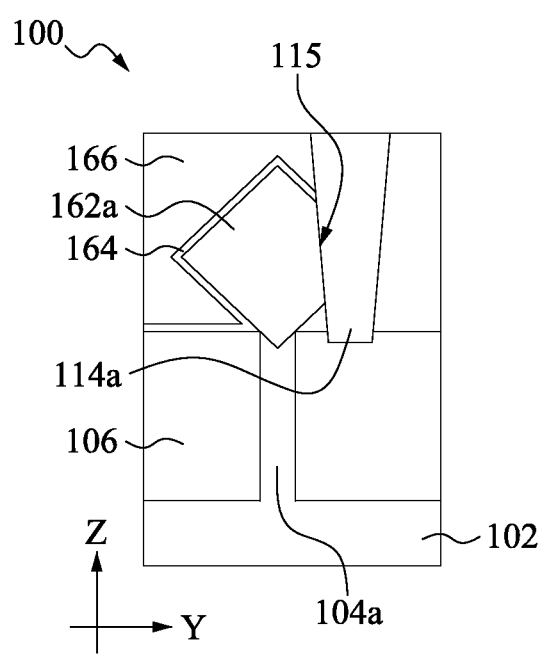

FIG. 1A illustrates a top view of a semiconductor device (or semiconductor structure) 100. FIG. 1B illustrates a cross-sectional view of the device 100 along the B-B line of FIG. 1A. FIG. 1C illustrates a cross-sectional view of the device 100 along the C-C line of FIG. 1A. FIG. 1D illustrates a cross-sectional view of the device 100 along the D-D line of FIG. 1A.

Referring to FIGS. 1A-1B, the device 100 includes a substrate 102, a plurality of fins 104 protruding out of the substrate 102 including fins 104a in a first device region 103a and fins 104b in a second device region 103b, an isolation structure 106 over the substrate 102 and between the fins 104, and a plurality of gate structures 112 disposed over the fins 104 and the isolation structure 106.

The fins 104 are oriented lengthwise along X direction and spaced from each other along Y direction perpendicular to the X direction. In the present embodiment, the fins 104a are designed for forming p-type FinFETs; and the fins 104b are designed for forming n-type FinFETs. The fins 104a have an edge-to-edge spacing P1 along the Y direction. In an embodiment, P1 ranges from 20 to 30 nm, which is smaller than traditional fin configurations where adjacent epitaxial S/D features are formed separately (not merged). In a particular embodiment, P1 is designed to be few nanometers greater than a resolution of a lithography exposure tool, such as an extreme ultraviolet (EUV) exposure tool whose resolution is about 13.3 nm in an embodiment. The smaller spacing P1 advantageously increases device integration. Some of the fins 104b are placed close to each other for forming multi-fin transistors for boosting device performance. In the embodiment shown in FIG. 1A, there are two groups of dual fins 104b. The spacing between the fin 104a and a nearby fin 104b is P2, which ranges from 40 to 50 nm in an embodiment. The spacing between two groups of fins 104b is P3, which ranges from 40 to 50 nm in an embodiment. In various embodiments, a group of fins 104b may include two (as shown), three, or more fins for forming multi-fin transistors.

The gate structures 112 are oriented lengthwise along the Y direction, and are spaced from each other along the X direction. The gate structures 12 engage the fins 104a and 104b in their respective channel regions to thereby form FinFETs. In the present embodiment, the gate structures 112 engage the fins 104a to form p-type FinFETs, which may be used for pull-up (PU) devices in SRAM cells; and the gate structures 112 engage the fins 104b to form n-type FinFETs, which may be used for pull-down (PD) devices or pass-gate (PG) devices in SRAM cells. Due to the reduced spacing P1, the SRAM cells configured with the present PU, PD, and PG devices have a smaller area than traditional SRAM cells.

Still referring to FIGS. 1A-1B, the device 100 further includes S/D features 162, including S/D features 162a and 162b disposed over the fins 104a and 104b respectively. It is noted that not all of the S/D features 162 are illustrated in FIG. 1A for the sake of simplicity. Generally, S/D features 162 are disposed on each of the fins 104 in their respective S/D regions. In an embodiment, the S/D features 162a include p-type doped silicon germanium, while the S/D features 162b include n-type doped silicon.

The device 100 further includes a dielectric layer 114, including dielectric features 114a, 114b, and 114c. Particularly, the dielectric features 114a are disposed between two rows of fins 104a in the device region 103a, and the dielectric features 114b and 114c are disposed between two groups of fins 104b in the device region 103b, as well as between the device regions 103a and 103b. The dielectric layer 114 fills in CMG trenches, and is therefore referred to as CMG dielectric layer 114. The CMG dielectric layer 114 is arranged lengthwise along the X direction and separates some of the gate structures 112 into at least two portions. In the present embodiment, the areas indicated by the dashed boxes 113a and 113b are processed by one exposure and etching process, while the areas indicated by the dashed boxes 113c are process by another exposure and etching process. This aspect will be discussed in detail later. The dielectric features 114a are disposed within the dashed box 113a and expand from one edge of a gate structure 112 to an adjacent edge of the gate structure 112 along the X direction. The dielectric features 114b are disposed within the dashed boxes 113b and expand from one edge of a gate structure 112 to an adjacent edge of the gate structure 112 along the X direction. The dielectric features 114c are disposed within the dashed boxes 113c and expand from one edge of a gate structure 112 to an adjacent edge of the gate structure 112 along the Y direction. In the present embodiment, the dielectric features 114b are wider than the dielectric features 114c along the Y direction. The dielectric features 114a, 114b, and 114c include the same dielectric material(s) in the present embodiment. The width W1 of the dielectric features 114a along the Y direction is smaller than P1 and ranges from 16 to 18 nm in an embodiment. In an embodiment, the width W1 is designed to be the same or slightly greater than the resolution of the lithography exposure tool, such as an EUV exposure tool whose resolution is about 13.3 nm.

Referring to FIG. 1B, the CMG dielectric feature 114a is disposed between and in physical contact with two S/D features 162a. In an embodiment, the interfaces 115 between the CMG dielectric feature 114a and the two S/D features 162a are two generally straight lines in this cross-sectional view, whose straightness depends on the etching and deposition processes that form the CMG dielectric features 114a as will be discussed later. In an embodiment, each of the interfaces 115 forms an angle ranging from 0 to 5 degrees with normal (Z direction) of a top surface of the substrate 102. In an embodiment, the horizontal (along the Y direction) distances between the two interfaces 115 at different heights (along the Z direction) are about the same or linearly and monotonically decrease from top to bottom. In another embodiment, the two interfaces 115 are tilted toward each other from top to bottom regardless whether or not they are generally straight lines. The interfaces 115 are different from other facets of the S/D features 162a. The other facets are formed by epitaxial growth process and generally follow the crystalline orientation of the semiconductor material(s) of the S/D features 162a, while the interfaces 115 are formed by etching the S/D features 162a regardless of the underlying crystalline orientation.

Referring to FIG. 1C, each gate structure 112 includes a high-k dielectric layer 108 and a conductive layer 110 over the high-k dielectric layer 108. The conductive layer 110 includes one or more layers of metallic materials. Therefore, each gate structure 112 is also referred to as a high-k metal gate (or HK MG) 112. The gate structures 112 may further include an interfacial layer (not shown) under the high-k dielectric layer 108. The CMG dielectric feature 114c separates the gate structure 112 into left and right portions. The left portion engages a fin 104a to form a transistor, and the right portion engages two fins 104b to form another transistor.

Referring to FIG. 1D, in this cross-sectional view, the CMG dielectric feature 114a is in physical contact with only one S/D feature 162a. The above discussion of the S/D feature 162a, the interface 115, and the CMG dielectric feature 114a also applies to FIG. 1D.

The device 100 further includes one or more dielectric layers, such as a contact etch stop layer (CESL) 164 disposed over the S/D features 162 and the isolation structure 106, and an inter-layer dielectric (ILD) layer 166 disposed over the isolation structure 106, the fins 104, the gate structures 112, and the CESL 164. The components of the device 100 are further described below.

The substrate 102 is a silicon substrate in the present embodiment. Alternatively, the substrate 102 may comprise another elementary semiconductor, such as germanium; a compound semiconductor including silicon carbide, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof.

The fins 104 may comprise one or more semiconductor materials such as silicon, germanium, silicon carbide, gallium arsenide, gallium phosphide, indium phosphide, indium arsenide, indium antimonide, silicon germanium, gallium arsenide phosphide, aluminum indium phosphide, aluminum gallium arsenide, gallium indium arsenide, gallium indium phosphide, and gallium indium arsenide phosphide. In an embodiment, the fins 104 may include alternately stacked layers of two different semiconductor materials, such as layers of silicon and silicon germanium alternately stacked. The fins 104 may additionally include dopants for improving the performance of the device 100. For example, the fins 104 may include n-type dopant(s) such as phosphorus or arsenic, or p-type dopant(s) such as boron or indium.

The isolation structure 106 may comprise silicon oxide, silicon nitride, silicon oxynitride, fluoride-doped silicate glass (FSG), a low-k dielectric material, and/or other suitable insulating material. The isolation structure 106 may be shallow trench isolation (STI) features. Other isolation structure such as field oxide, LOCal Oxidation of Silicon (LOCOS), and/or other suitable structures are possible. The isolation structure 106 may include a multi-layer structure, for example, having one or more thermal oxide liner layers adjacent to the fins 104.

The high-k dielectric layer 108 may include one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof.

The conductive layer 110 includes one or more metal layers, such as work function metal layer(s), conductive barrier layer(s), and metal fill layer(s). The work function metal layer may be a p-type or an n-type work function layer depending on the type (PFET or NFET) of the device. The p-type work function layer comprises a metal selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. The metal fill layer may include aluminum (Al), tungsten (W), cobalt (Co), and/or other suitable materials.

The CMG dielectric layer 114 may include one or more dielectric materials, such as silicon nitride, silicon oxide, silicon oxynitride, fluoride-doped silicate glass (FSG), a low-k dielectric material, and/or other suitable insulating material; and may be formed by CVD (chemical vapor deposition), PVD (physical vapor deposition), ALD (atomic layer deposition), or other suitable methods.

The CESL 164 may comprise silicon nitride, silicon oxynitride, silicon nitride with oxygen (O) or carbon (C) elements, and/or other materials; and may be formed by CVD, PVD, ALD, or other suitable methods. The ILD layer 166 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 166 may be formed by PECVD (plasma enhanced CVD), FCVD (flowable CVD), or other suitable methods.

Figure 2A:
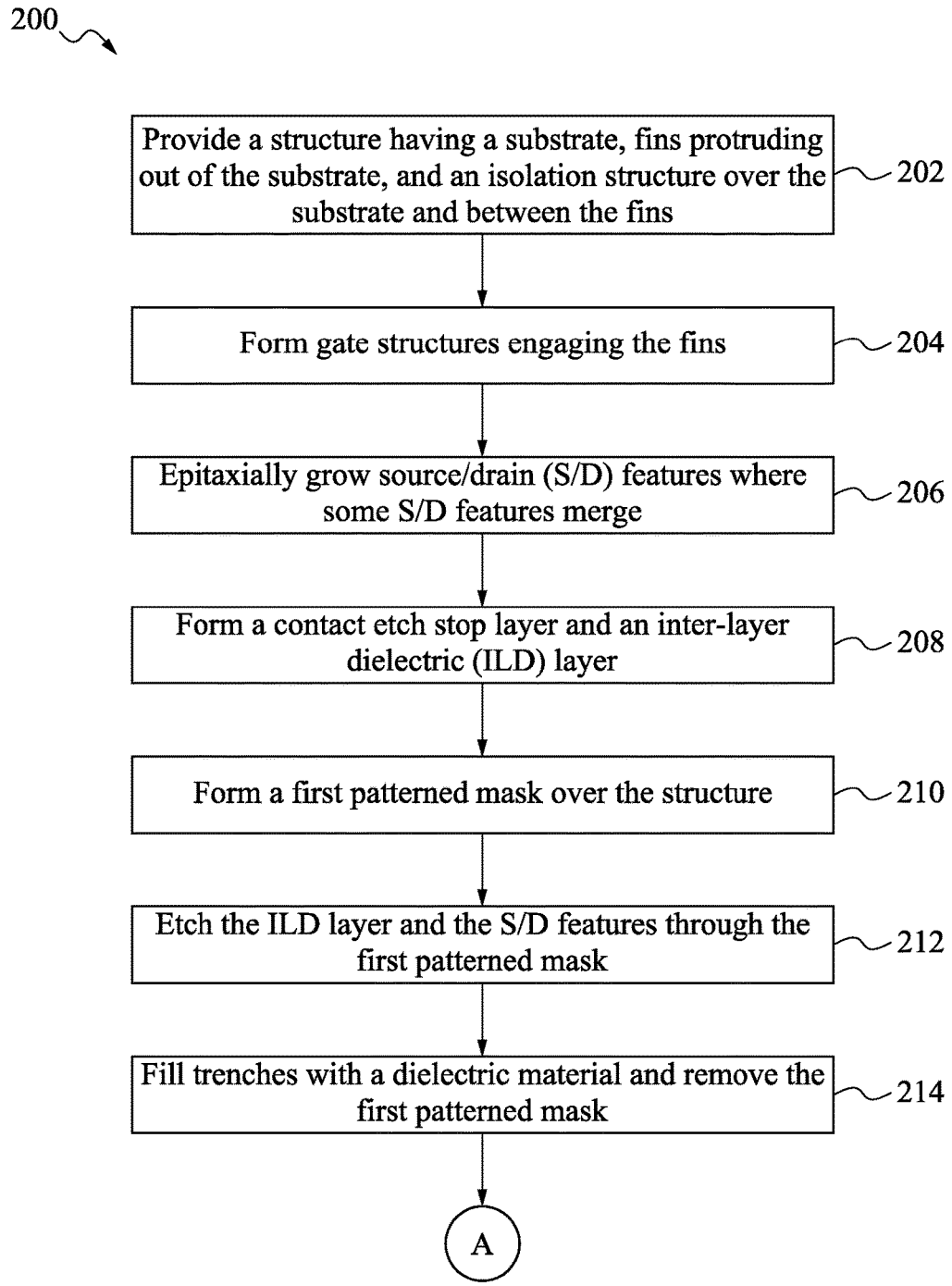
FIGS. 2A, 2B, and 2C show a flow chart of a method for forming the structure shown in FIGS. 1A-1D, according to aspects of the present disclosure.
Figure 2B:
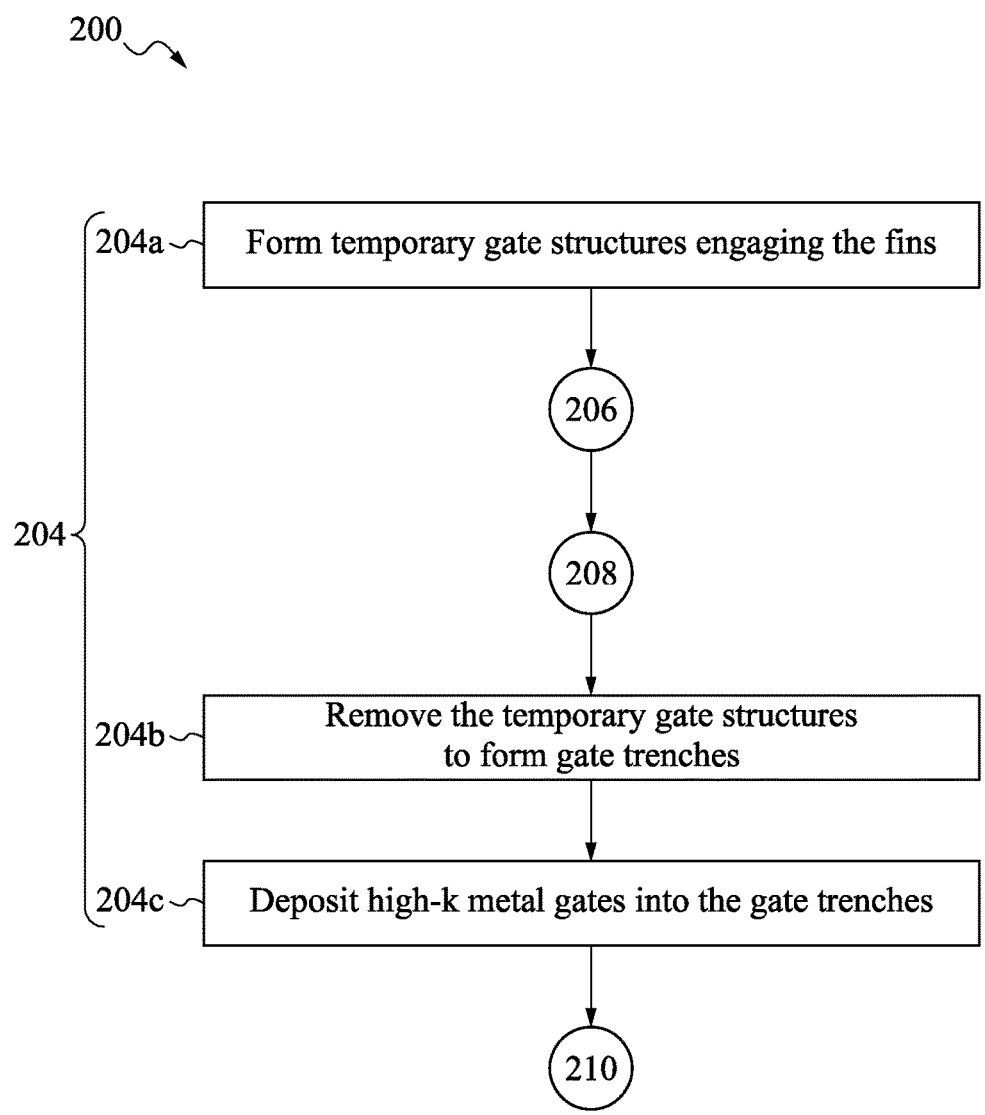
Figure 2C:
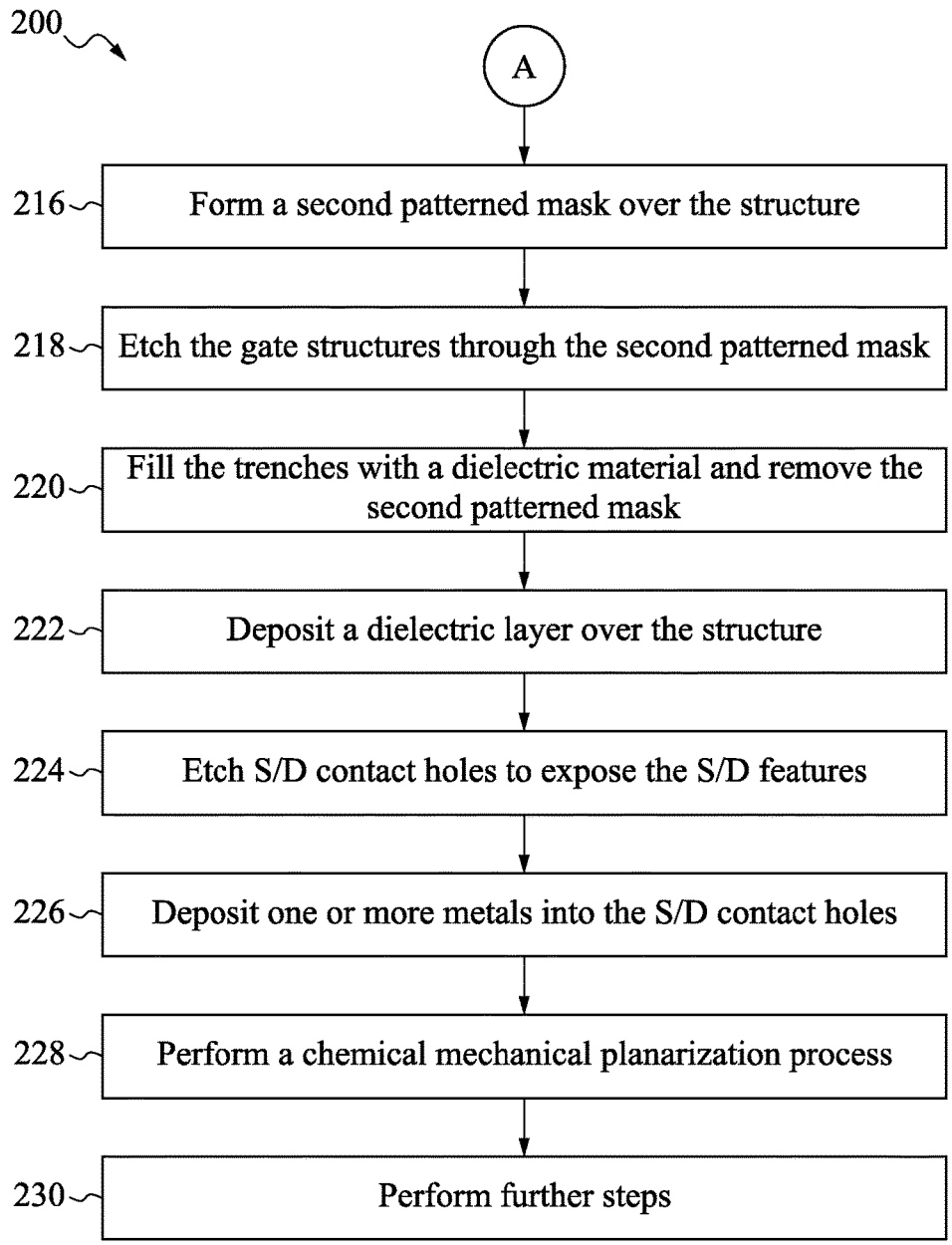

FIGS. 2A, 2B, and 2C illustrate a flow chart of a method 200 for forming the semiconductor device 100 in accordance with an embodiment. The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3A-18, which illustrate various cross-sectional views of the semiconductor device 100 during fabrication steps according to the method 200.

Figure 3A:
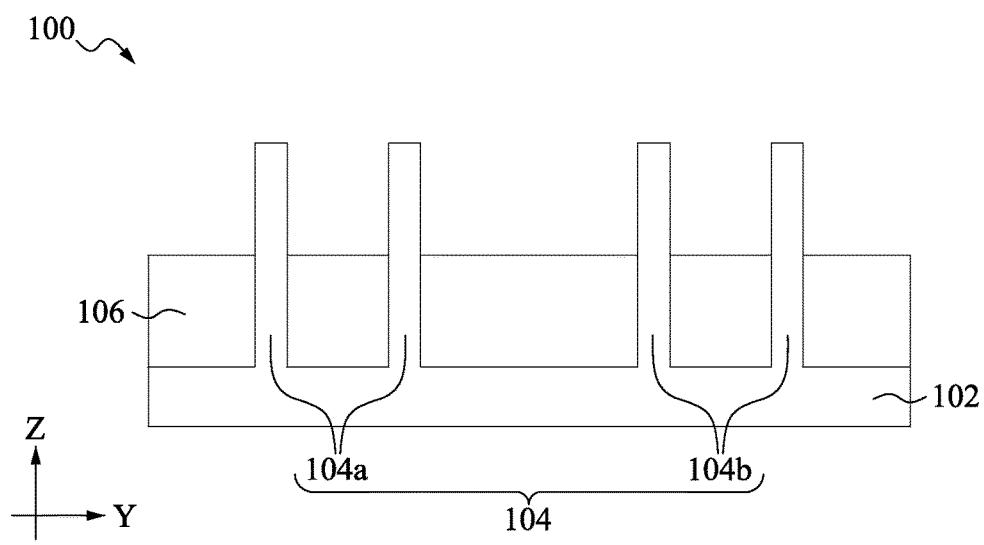
FIGS. 3A, 3B, 4A, 4B, 5A, 5B, 6A, 6B, 7A, 7B, 8A, 8B, 9A, 9B, 10, 11, 12A, 12B, 13, 14A, 14B, 15, 16, 17, and 18 illustrate cross-sectional views of a semiconductor structure during a fabrication process according to the method of FIGS. 2A-2C, in accordance with some embodiments.
Figure 3B:
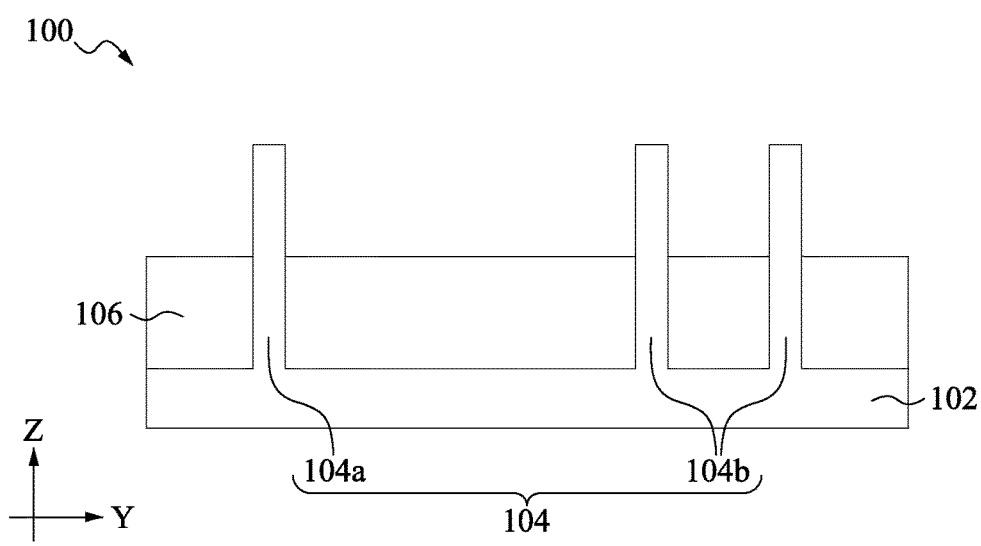

At operation 202, the method 200 (FIG. 2A) provides, or is provided with, a device structure 100 having a substrate 102, fins 104 (including fins 104a and 104b) protruding out of the substrate 102, and an isolation structure 106 over the substrate 102 and between the fins 104, such as shown in FIGS. 3A and 3B. Particularly, FIGS. 3A and 3B show cross-sectional views of the device structure 100 along the B-B line and the C-C line of FIG. 1A, respectively. The various materials for the substrate 102, the fins 104, and the isolation structure 106 have been discussed above with reference to FIGS. 1A-1D.

In an embodiment, the substrate 102 may be a wafer, such as a silicon wafer. The fins 104 can be formed by epitaxially growing one or more semiconductor layers over the entire area of the substrate 102 and then patterned to form the individual fins 104. The fins 104 may be patterned by any suitable method. For example, the fins 104 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 104 by etching the initial epitaxial semiconductor layers. The etching process can include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

The isolation structure 106 may be formed by one or more deposition and etching methods. The deposition methods may include thermal oxidation, chemical oxidation, and chemical vapor deposition (CVD) such as flowable CVD (FCVD). The etching methods may include dry etching, wet etching, and chemical mechanical planarization (CMP).

At operation 204, the method 200 (FIG. 2A) forms gate structures 112 engaging the fins 104. In an embodiment, the operation 204 includes depositing the various layers of the gate structures 112 including the gate dielectric layer 108 and the conductive layer 110, and patterning the various layers to form the gate structures 112 as illustrated in FIGS. 1A and 1C. In a particular embodiment, the operation 204 uses a replacement gate process where it first forms temporary (or dummy) gate structures and then replaces the temporary gate structures with the gate structures 112. An embodiment of the replacement gate process is illustrated in FIG. 2B including operations 204a, 204b, and 204c, which are further discussed below.

Figure 4A:
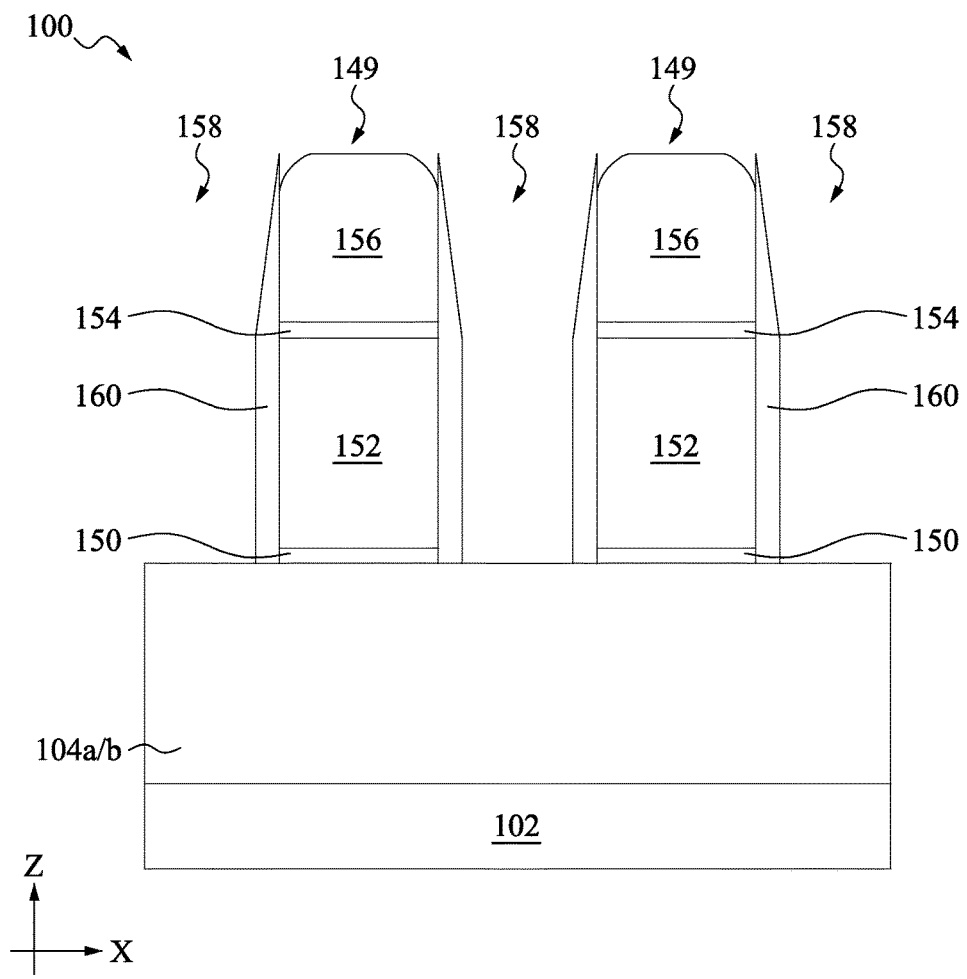
Figure 4B:
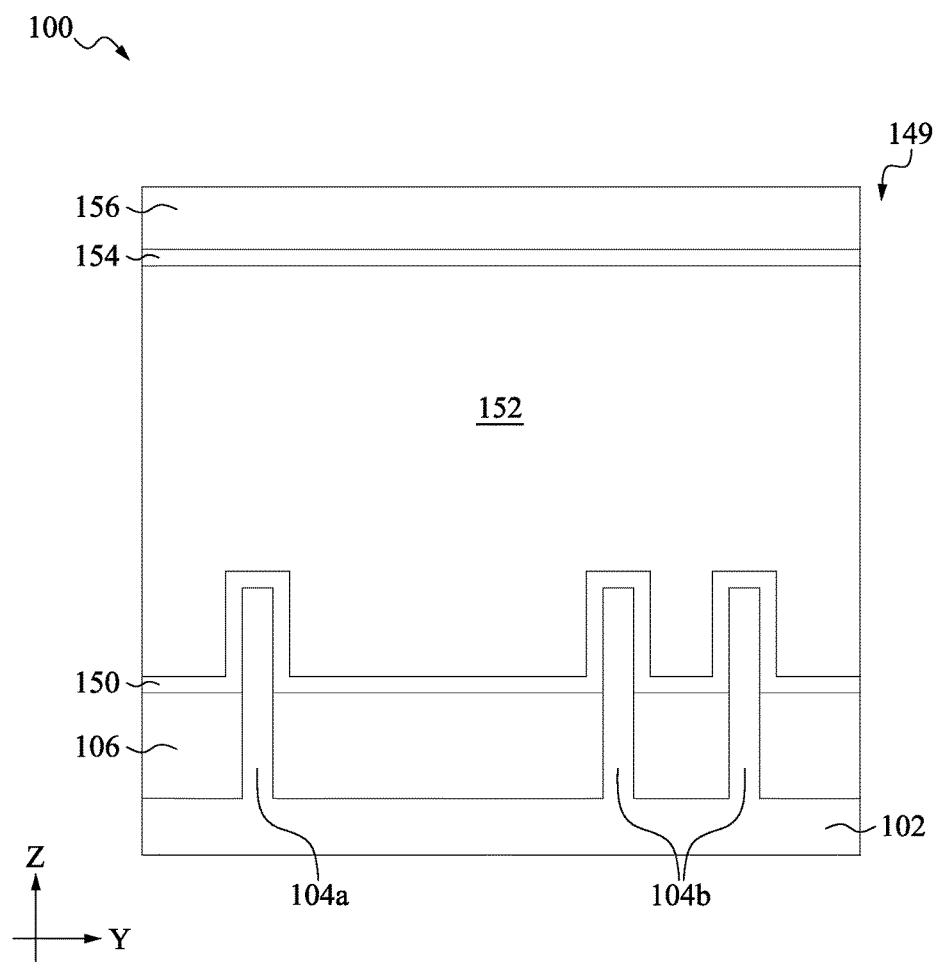

At operation 204a, the method 200 (FIG. 2B) forms temporary gate structures 149 engaging the fins 104 such as shown in FIGS. 4A and 4B, which show cross-sectional views of the device 100 cut along the A-A line and the C-C line of FIG. 1A, respectively. Referring to FIGS. 4A and 4B, each temporary gate structure 149 includes an interfacial layer 150, an electrode layer 152, and two hard mask layers 154 and 156. The operation 204a further forms gate spacers 160 on sidewalls of the temporary gate structures 149.

The interfacial layer 150 may include a dielectric material such as silicon oxide layer (e.g., $SiO_2$) or silicon oxynitride (e.g., SiON), and may be formed by chemical oxidation, thermal oxidation, atomic layer deposition (ALD), CVD, and/or other suitable methods. The gate electrode 152 may include poly-crystalline silicon (poly-Si) and may be formed by suitable deposition processes such as low-pressure chemical vapor deposition (LPCVD) and plasma-enhanced CVD (PECVD). Each of the hard mask layers 154 and 156 may include one or more layers of dielectric material such as silicon oxide and/or silicon nitride, and may be formed by CVD or other suitable methods. The various layers 150, 152, 154, and 156 may be patterned by photolithography and etching processes. The gate spacers 160 may comprise a dielectric material, such as silicon oxide, silicon nitride, silicon oxynitride, silicon carbide, other dielectric material, or combinations thereof, and may comprise one or multiple layers of material. The gate spacers 160 may be formed by depositing a spacer material as a blanket over the isolation structure 106, the fins 104, and the temporary gate structures 149. Then the spacer material is etched by an anisotropic etching process to expose the isolation structure 106, the hard mask layer 156, and a top surface of the fins 104. Portions of the spacer material on the sidewalls of the temporary gate structures 149 become the gate spacers 160. Adjacent gate spacers 160 provide trenches 158 that expose the fins 104 in the S/D regions of the device 100.

Figure 5A:
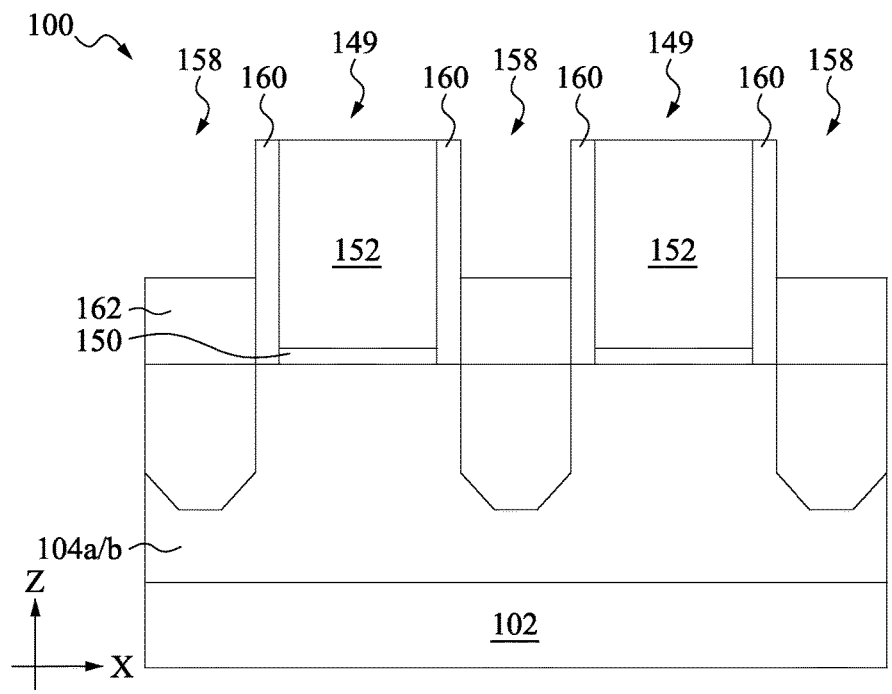
Figure 5B:
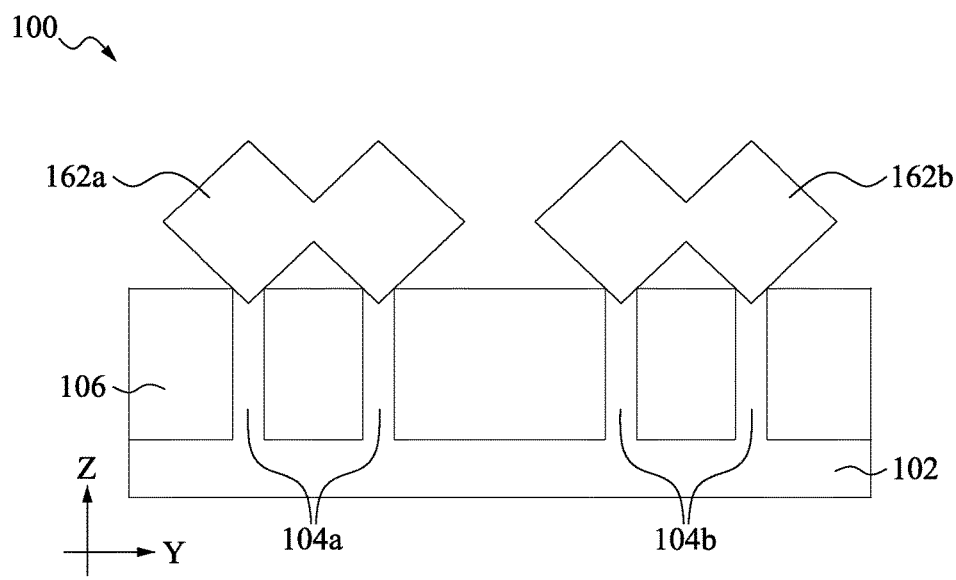

At operation 206, the method 200 (FIGS. 2A and 2B) forms source/drain (or S/D) features 162, such as shown in FIGS. 5A and 5B, which are cross-sectional views of the device 100 along the A-A line and the B-B line of FIG. 1A, respectively. For example, the operation 206 may etch recesses into the fins 104 exposed in the trenches 158, and epitaxially grow semiconductor materials in the recesses. The semiconductor materials may be raised above the top surface of the fins 104, as illustrated in FIGS. 5A and 5B. The operations 206 may form the S/D features 162 separately for NFET and PFET devices. For example, the operations 206 may form the S/D features 162b with n-type doped silicon for NFET devices and form the S/D features 162a with p-type doped silicon germanium for PFET devices. In the present embodiment, some of the S/D features 162 merge together, such as shown in FIG. 5B. Particularly, two S/D features 162a that are designed for two individual PFETs merge, and two S/D features 162b that are designed for a multi-fin NFET also merge. Typically, two S/D features that are designed for two individual transistors (as opposed to a multi-fin transistor) are not allowed to merge together. To avoid the merging, the spacing between the two fins 104a is typically designed to be greater than the lateral size of the S/D feature 162a. This typically requires either greater spacing (more area) for the two individual transistors or smaller epitaxial S/D features. Neither is ideal because the former would reduce device integration and the latter would increase S/D contact resistance. The present disclosure improves over the typical approaches by initially growing S/D features 162a large enough to merge and then etches the merged S/D feature to separate them, which will be discussed in details later.

Figure 6A:
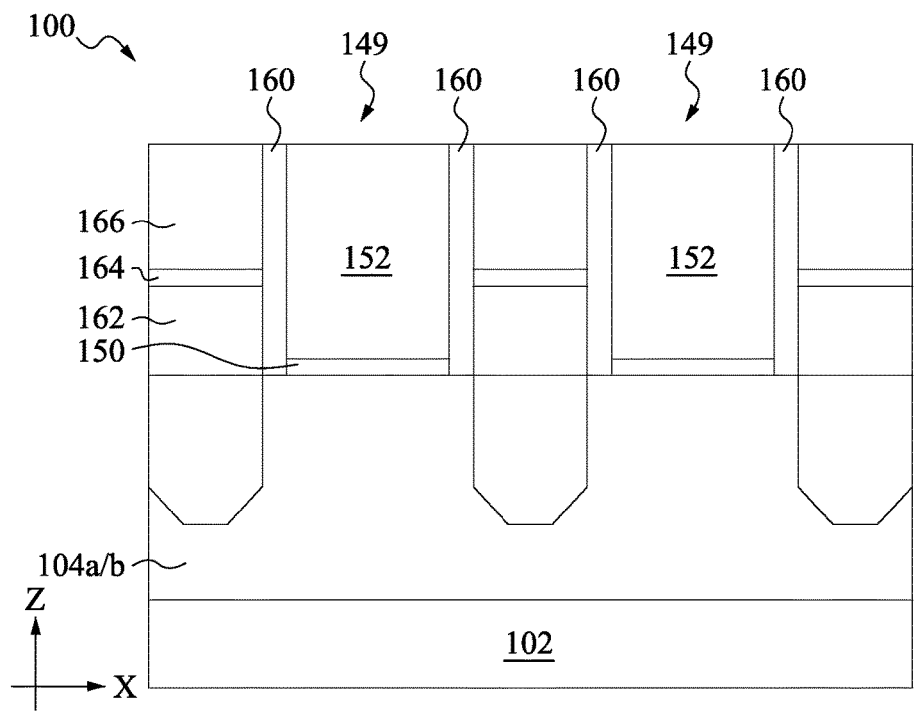
Figure 6B:
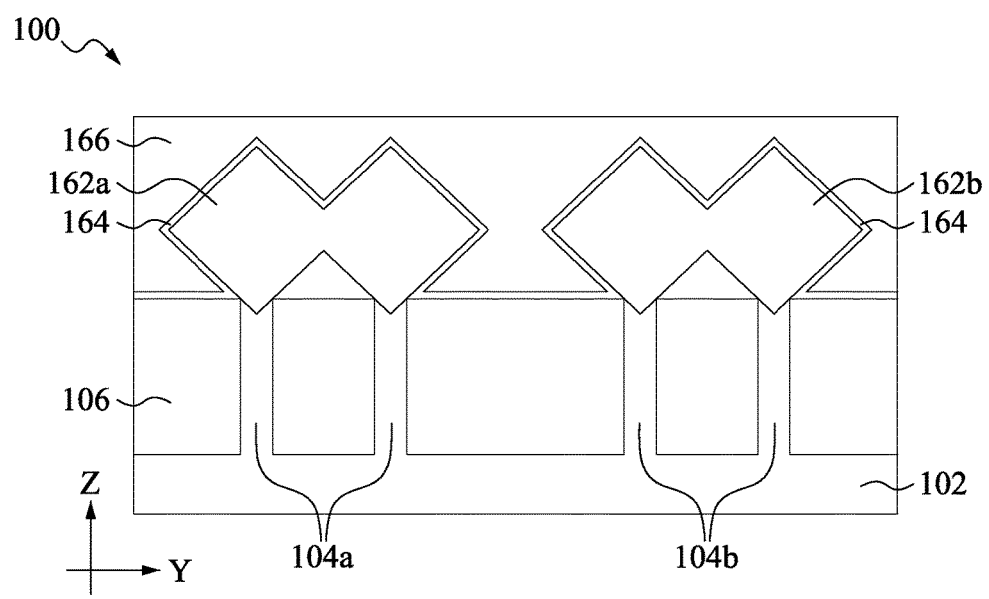

At operation 208, the method 200 (FIGS. 2A and 2B) forms various features including a contact etch stop layer (CESL) 164 over the S/D features 162, and an interlayer dielectric (ILD) layer 166 over the CESL 164, such as shown in FIGS. 6A and 6B, which are cross-sectional views of the device 100 along the A-A line and the B-B line of FIG. 1A, respectively. The CESL 164 may comprise silicon nitride, silicon oxynitride, silicon nitride with oxygen (O) or carbon (C) elements, and/or other materials; and may be formed by CVD, PVD (physical vapor deposition), ALD, or other suitable methods. The ILD layer 166 may comprise tetra-ethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 166 may be formed by PECVD, FCVD, or other suitable methods. The operation 208 may perform one or more CMP processes to planarize the top surface of the device 100, remove the hard mask layers 154 and 156, and expose the electrode layer 152.

Figure 7A:
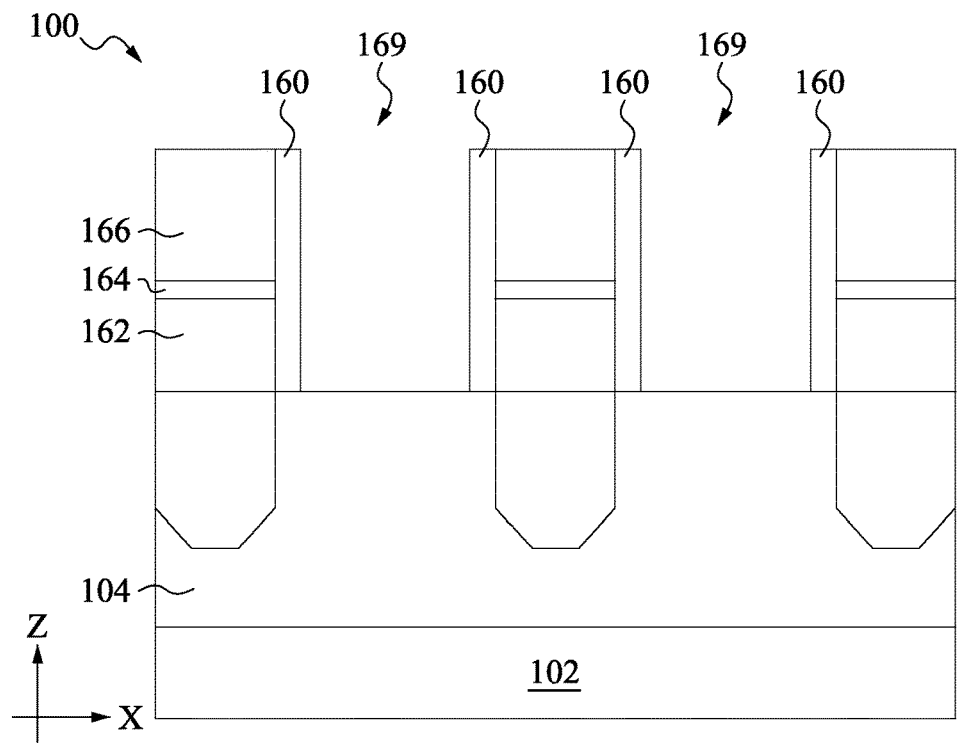
Figure 7B:
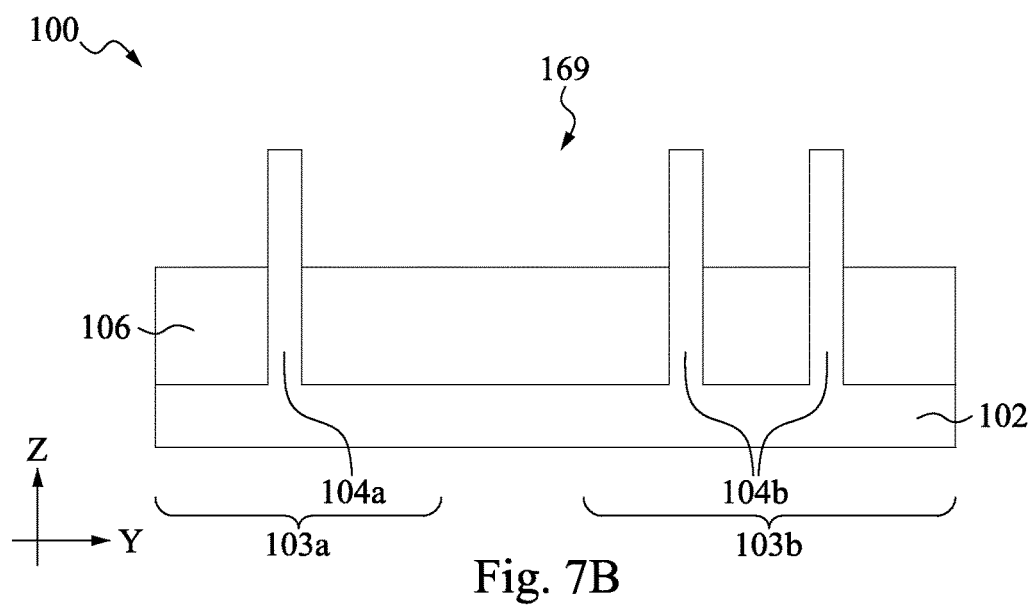

At operation 204b, the method 200 (FIG. 2B) removes the temporary gate structures 149 to form gate trenches 169, such as shown in FIGS. 7A and 7B, which are cross-sectional views of the device 100 along the A-A and C-C lines of FIG. 1A, respectively. The gate trenches 169 expose surfaces of the fins 104 and sidewall surfaces of the gate spacers 160. The operation 204b may include one or more etching processes that are selective to the material in the electrode layer 152 and the interfacial layer 150. The etching processes may include dry etching, wet etching, reactive ion etching, or other suitable etching methods.

Figure 8A:
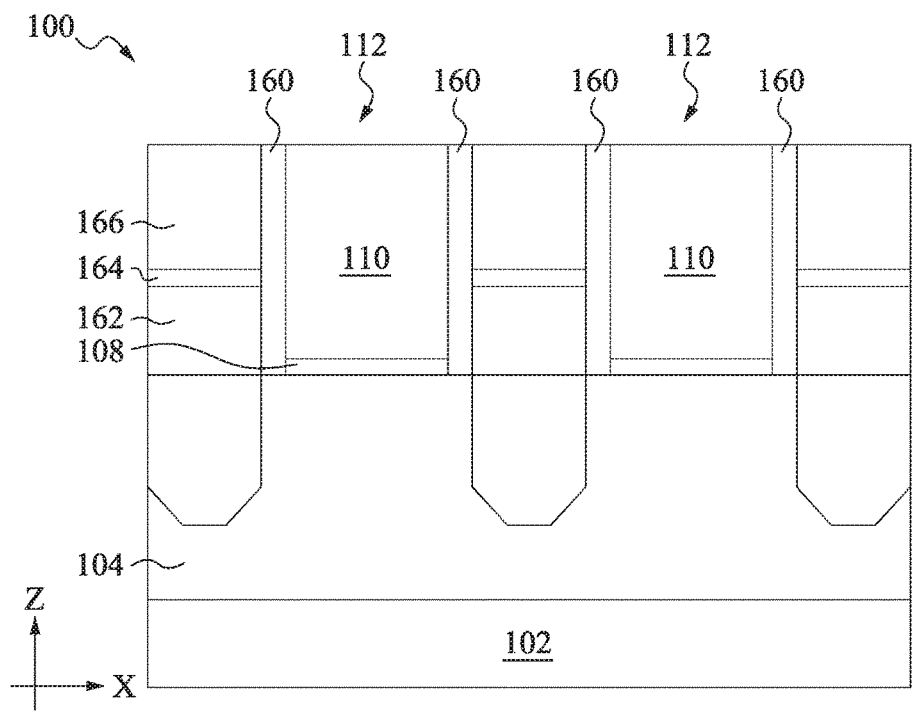
Figure 8B:
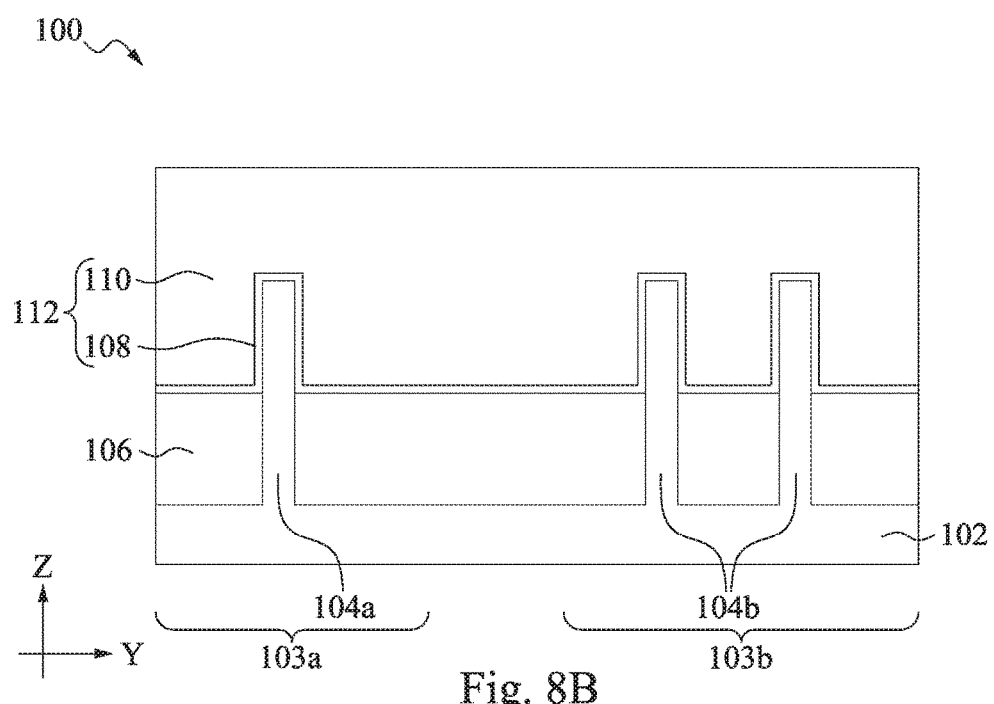

At operation 204c, the method 200 (FIG. 2B) deposits gate structures (e.g., high-k metal gates) 112 in the gate trenches 169, such as shown in FIGS. 8A and 8B which are cross-sectional views of the device 100 along the A-A and C-C lines of FIG. 1A, respectively. The gate structures 112 include the high-k dielectric layer 108 and the conductive layer 110. The gate structures 112 may further include an interfacial layer (e.g., $SiO_2$) (not shown) between the high-k dielectric layer 108 and the fins 104. The interfacial layer may be formed using chemical oxidation, thermal oxidation, ALD, CVD, and/or other suitable methods. The materials of the high-k dielectric layer 108 and the conductive layer 110 have been discussed above with reference to FIGS. 1A-1D. The high-k dielectric layer 108 may include one or more layers of high-k dielectric material, and may be deposited using CVD, ALD, and/or other suitable methods. The conductive layer 110 may include one or more work function metal layers and a metal fill layer, and may be deposited using methods such as CVD, PVD, plating, and/or other suitable processes.

Figure 9A:
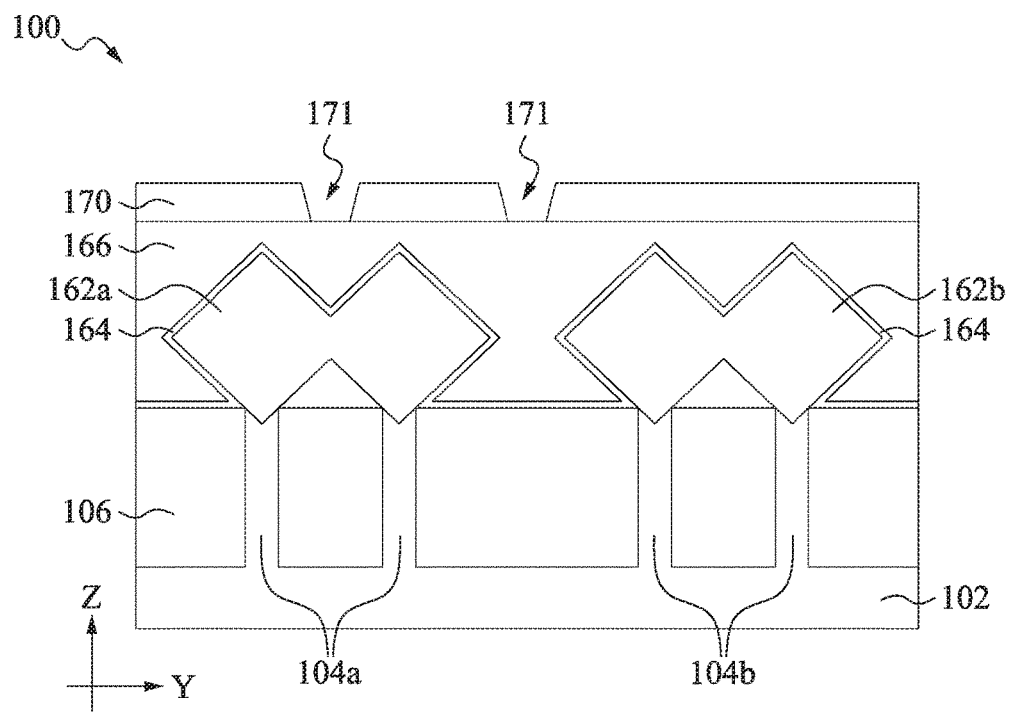
Figure 9B:
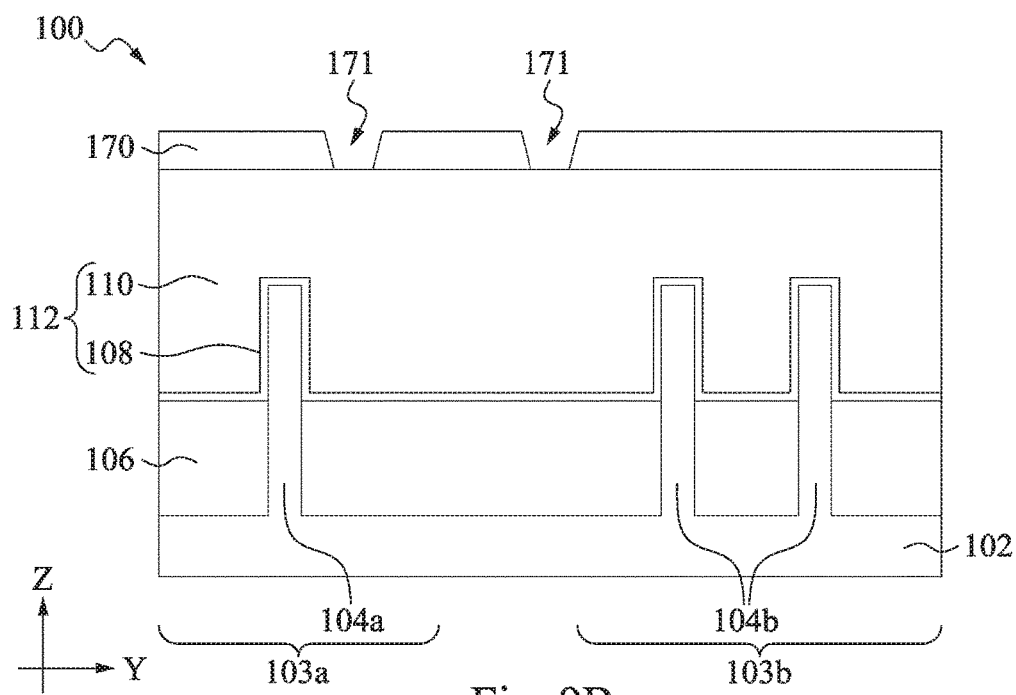

At operation 210, the method 200 (FIGS. 2A and 2B) forms one or more patterned hard mask layers over the device 100, such as shown in FIGS. 9A and 9B which are cross-sectional views of the device 100 along the B-B line and the C-C line of FIG. 1A, respectively. One hard mask layer 170 is illustrated in this example. The hard mask layer 170 may include titanium nitride, silicon nitride, amorphous silicon, yttrium silicate (YSiO$_x$), or other suitable hard mask material(s). In an embodiment, the operation 210 deposits the hard mask layer 170 using CVD, PVD, ALD, or other suitable methods, and subsequently patterns the hard mask layer 170 to form openings 171. The openings 171 correspond to the dashed boxes 113a and 113b of FIG. 1A. The openings 171 expose the conductive layer 110 and the ILD layer 166. In an example, the operation 210 may form a patterned photoresist over the hard mask layer 170 by photoresist coating, exposing, post-exposure baking, and developing. The patterned photoresist provides openings corresponding to the boxes 114a and 114b of FIG. 1A. In a particular embodiment, the operation 210 uses a single exposure process (e.g., using EUV exposure) to expose the photoresist layer to have a latent image that includes the dashed boxes 113a and 113b, and then develops the photoresist layer to provide the openings. Then, the operation 210 etches the hard mask layer 170 using the patterned photoresist as an etch mask to form the opening 171. The etching process may include wet etching, dry etching, reactive ion etching, or other suitable etching methods. The patterned photoresist is removed thereafter, for example, by resist stripping.

Figure 10:
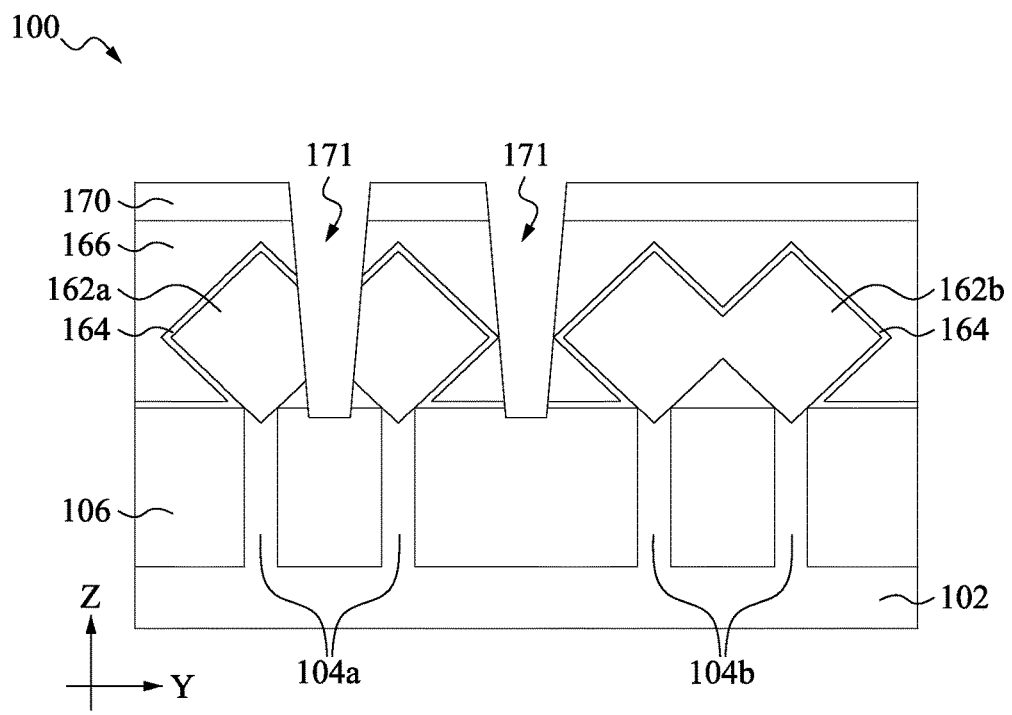

At operation 212, the method 200 (FIG. 2A) etches the device 100 through the openings 171. The patterned hard mask layer 170 protects the rest of the device 100 from the etching process. In the present embodiment, the operation 212 uses an etching process that is tuned to selectively etch the ILD layer 166 and the S/D features 162a without (or insignificantly) etching the gate structures (e.g., HK MG) 112. For example, the operation 212 may perform a dry etching process using hydrogen fluoride (HF) and ammonia, and may use argon gas as a carrier gas. These etchants are selective to oxide (in the ILD layer 166) and silicon or silicon-germanium (in the S/D features 162), and do not etch well the conductive layer 110 in the gate structures 112. Referring to FIG. 10 which is a cross-sectional view of the device 100 along the B-B line of FIG. 1A, the operation 212 extends the openings 171 down and through the ILD layer 166 and the S/D features 162a and may extend the openings 171 into the isolation structure 106. In the cross-sectional view of the device 100 along the C-C line of FIG. 1A, the device 100 remains about the same as shown in FIG. 9B because the etching process is tuned to not etch the conductive layer 110.

Figure 11:
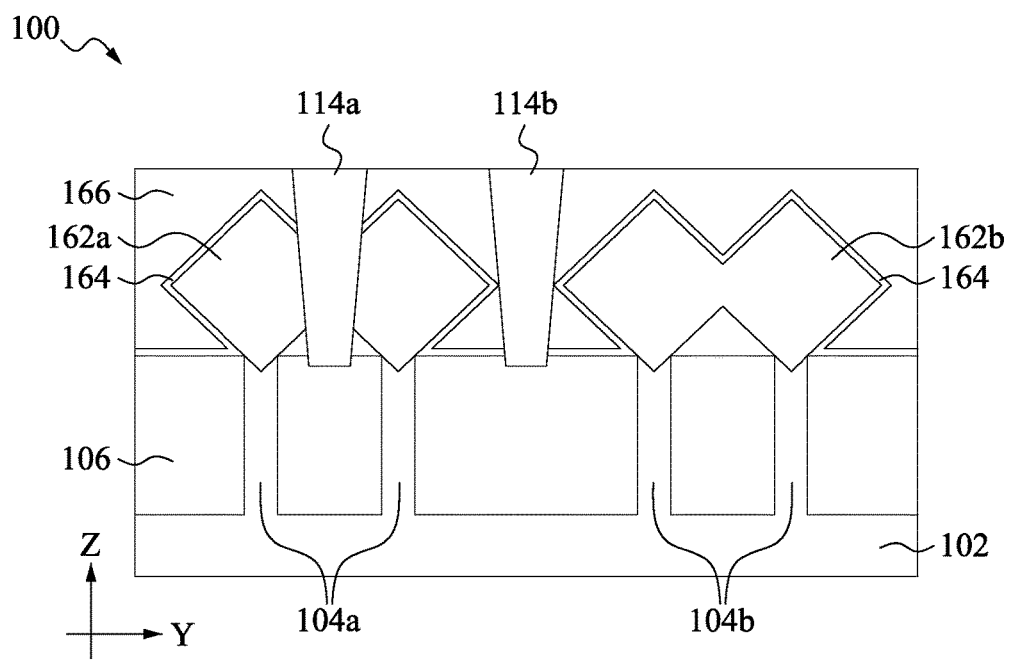

At operation 214, the method 200 (FIG. 2A) fills the trenches 171 with one or more dielectric materials to form the dielectric layer 114 including the dielectric features 114a and 114b, and performs a chemical mechanical polishing (CMP) process to remove the patterned hard mask 170 and to planarize the top surface of the device 100. The resultant device 100 is illustrated in FIG. 11. Since the sidewalls of the gate structures 112 contain metallic materials, at least the outer portion of the dielectric layer 114 (that is in direct contact with the sidewalls of the gate structures 112) is free of active chemical components such as oxygen. For example, the outer portion of the dielectric layer 114 may include silicon nitride and is free of oxygen or oxide. The dielectric layer 114 may include some oxide in the inner portion thereof in some embodiments. Alternatively, the dielectric layer 114 may include one uniform layer of silicon nitride and is free of oxide. The dielectric layer 114 may be deposited using CVD, PVD, ALD, or other suitable methods. In the present embodiment, the dielectric layer 114 is deposited using ALD to ensure that it completely fills the trenches 171.

Figure 12A:
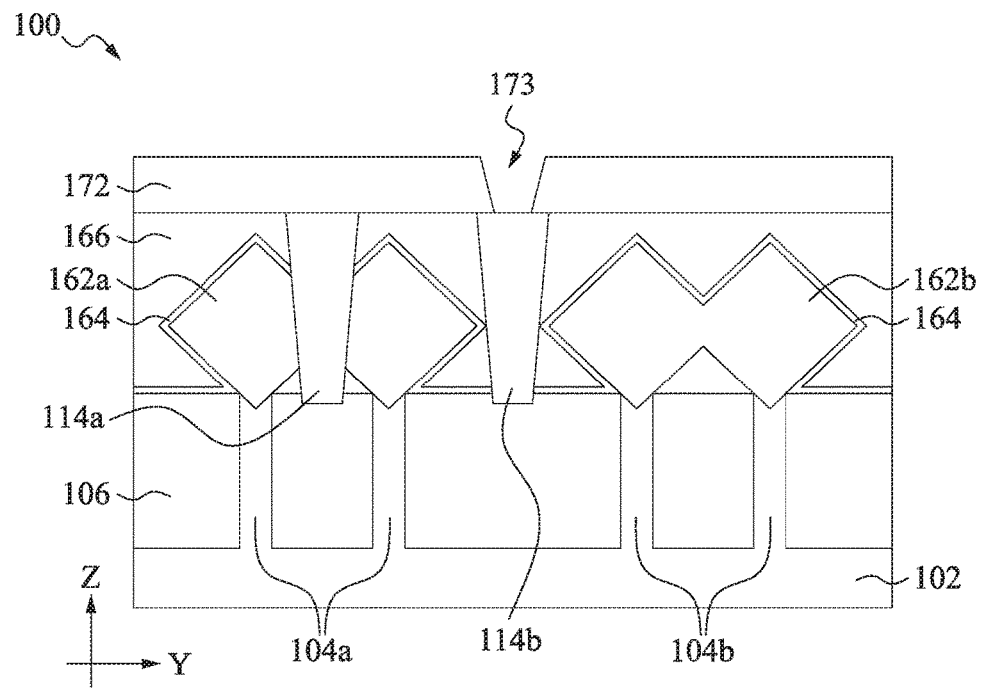
Figure 12B:
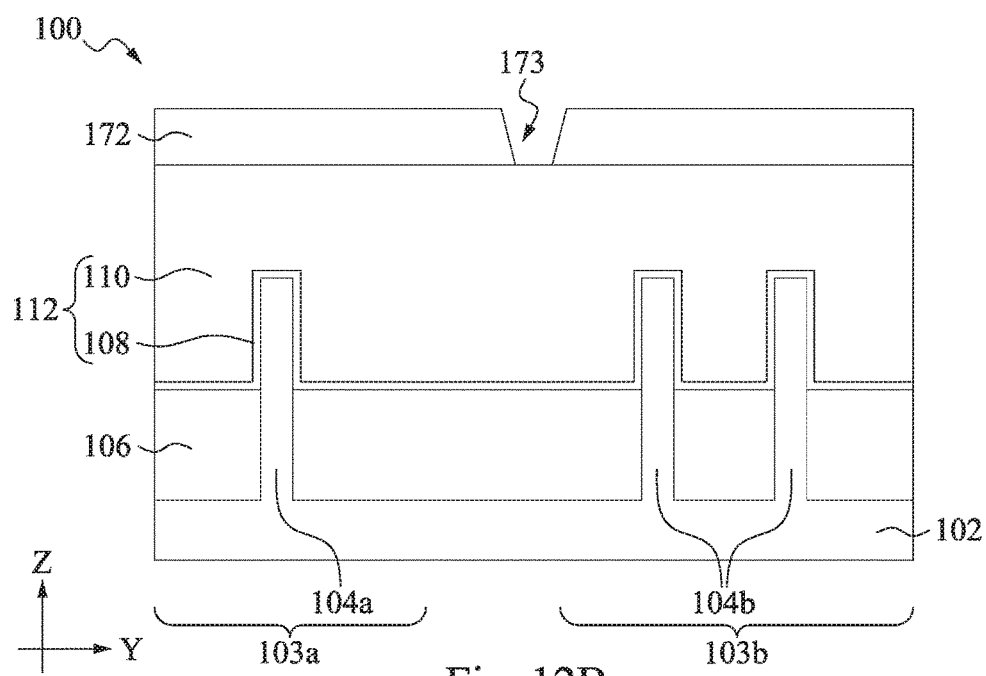

At operation 216, the method 200 (FIG. 2C) forms another patterned mask 172 over the device 100. The patterned mask 172 provides openings 173 such as shown in FIGS. 12A and 12B, which are cross-sectional views of the device 100 along the B-B line and the C-C line of FIG. 1A, respectively. The openings 173 correspond to the dashed boxes 113c of FIG. 1A. Particularly, the openings 173 expose portions of the gate structures 112 that are to be cut. The openings 173 may be formed by a single patterning process or multiple patterning processes. The hard mask layer 172 may include titanium nitride, silicon nitride, amorphous silicon, yttrium silicate (YSiO$_x$), or other suitable hard mask material(s); and may be deposited using CVD, PVD, ALD, or other suitable methods. In an example, the operation 216 may form a patterned photoresist over the hard mask layer 172 by photoresist coating, exposing, post-exposure baking, and developing. Then, the operation 216 etches the hard mask layer 172 using the patterned photoresist as an etch mask to form the opening 173. The etching process may include wet etching, dry etching, reactive ion etching, or other suitable etching methods. The patterned photoresist is removed thereafter, for example, by resist stripping.

Figure 13:
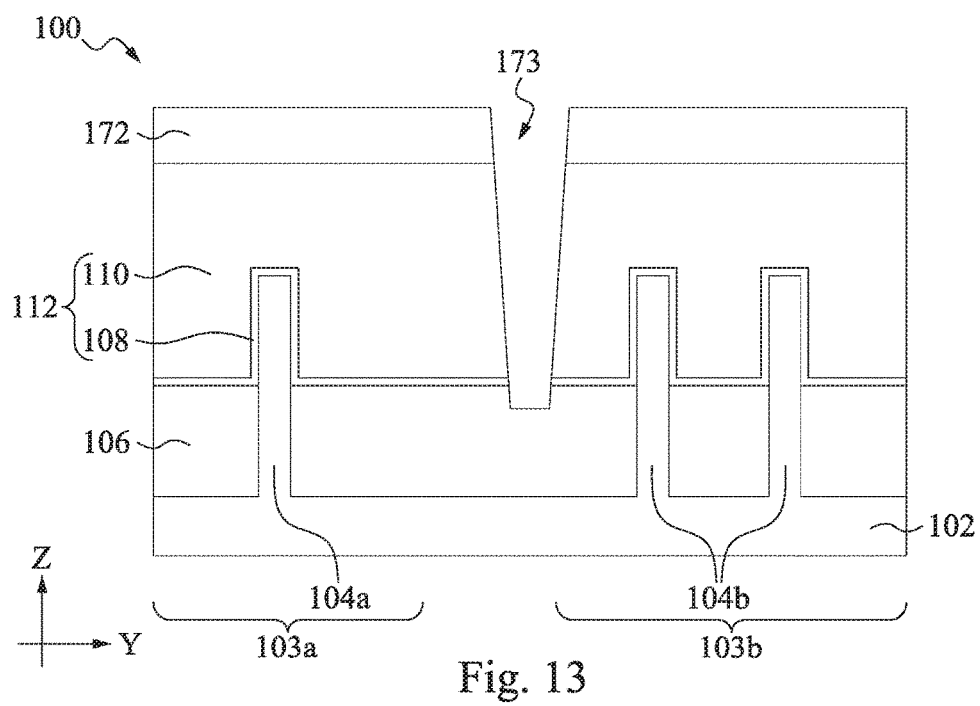

At operation 218, the method 200 (FIG. 2C) etches the gate structures 112 through the openings 173. Referring to FIG. 13, the operation 218 extends the opening 173 down and through the gate structures 112, and also into the isolation structure 106 in an embodiment. The etching process may use one or more etchants or a mixture of etchants that etch the various layers in the gate structures 112. In an exemplary embodiment, the conductive layer 110 includes TiSiN, TaN, TiN, W, or a combination thereof. To etch such a conductive layer and the high-k dielectric layer 108, the operation 218 may apply a dry etching process with an etchant having the atoms of chlorine, fluorine, bromine, oxygen, hydrogen, carbon, or a combination thereof. For example, the etchant may have a gas mixture of $Cl_2$, $O_2$, a carbon-and-fluorine containing gas, a bromine-and-fluorine containing gas, and a carbon-hydrogen-and-fluorine containing gas. In one example, the etchant includes a gas mixture of $Cl_2$, $O_2$, $CF_4$, $BCl_3$, and $CHF_3$. To ensure the isolation between the remaining portions of the gate structure 112, the operation 218 performs some over-etching to extend the openings 173 into the isolation structure 106 in some embodiments. Such over-etching is carefully controlled to not expose the substrate 102.

At operation 220, the method 200 (FIG. 2C) fills the trenches 173 with one or more dielectric materials to form the dielectric features 114c, and performs a chemical mechanical polishing (CMP) process to remove the patterned hard mask 172 and to planarize the top surface of the device 100.

Figure 14A:
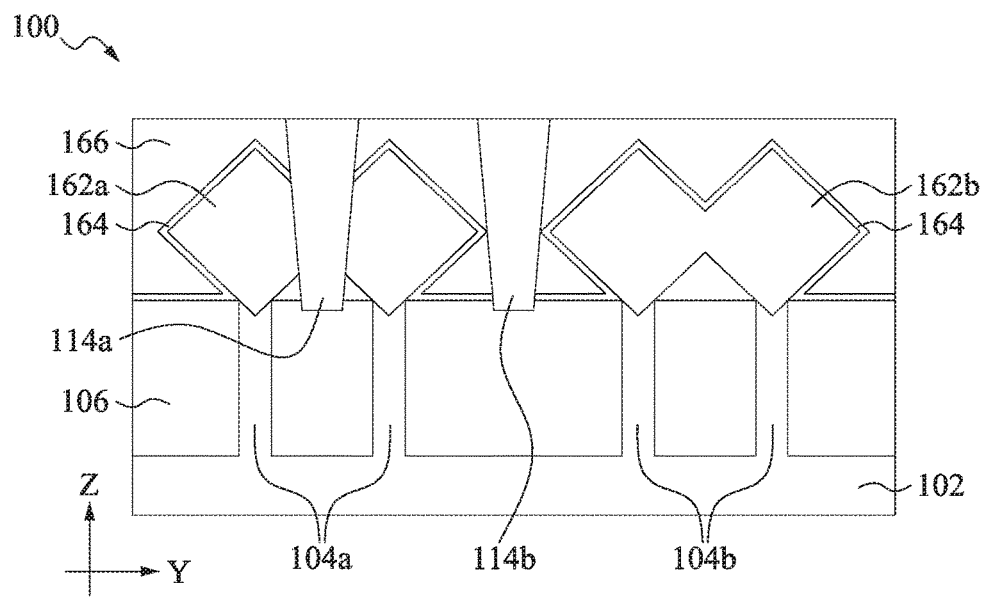
Figure 14B:
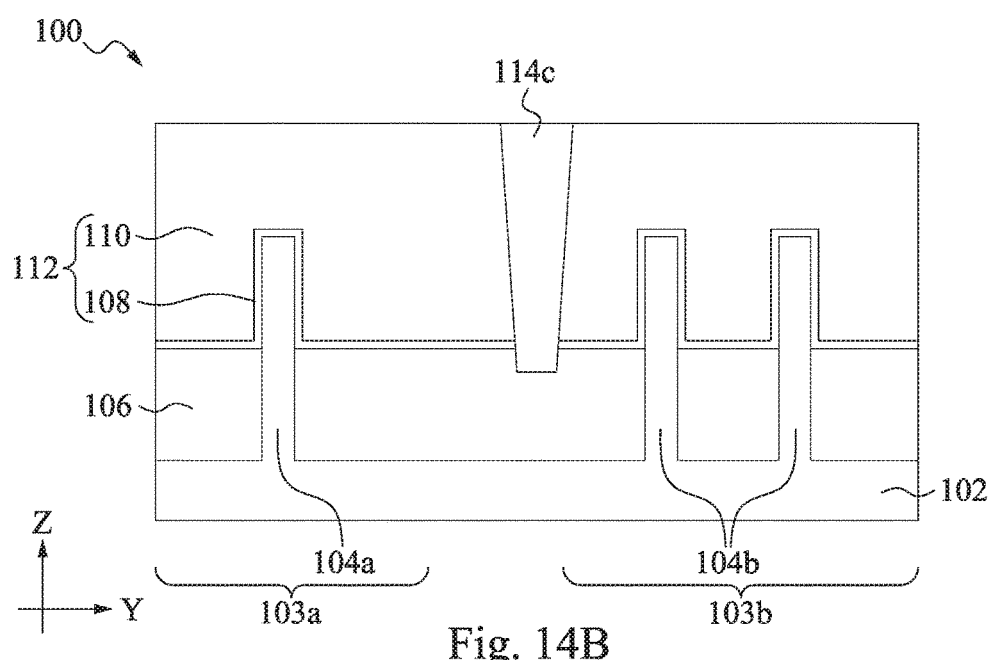

The resultant structure is shown in FIGS. 14A and 14B which are cross-sectional views of the device 100 along the B-B line and the C-C line of FIG. 1A, respectively. Particularly, the one or more dielectric materials in the trench 171 form the dielectric features 114a and 114b, and the one or more dielectric materials in the trenches 173 form the dielectric features 114c. Since the sidewalls of the gate structures 112 contain metallic materials, at least the outer portion of the dielectric layer 114 (that is in direct contact with the sidewalls of the gate structures 112) is free of active chemical components such as oxygen. For example, the outer portion of the dielectric layer 114 may include silicon nitride and is free of oxygen or oxide. The dielectric layer 114 may include some oxide in the inner portion thereof in some embodiments. Alternatively, the dielectric layer 114 may include one uniform layer of silicon nitride and is free of oxide. The dielectric layer 114 may be deposited using CVD, PVD, ALD, or other suitable methods. In the present embodiment, the dielectric layer 114 is deposited using ALD to ensure that it completely fills the trenches 171 and 173.

Figure 15:
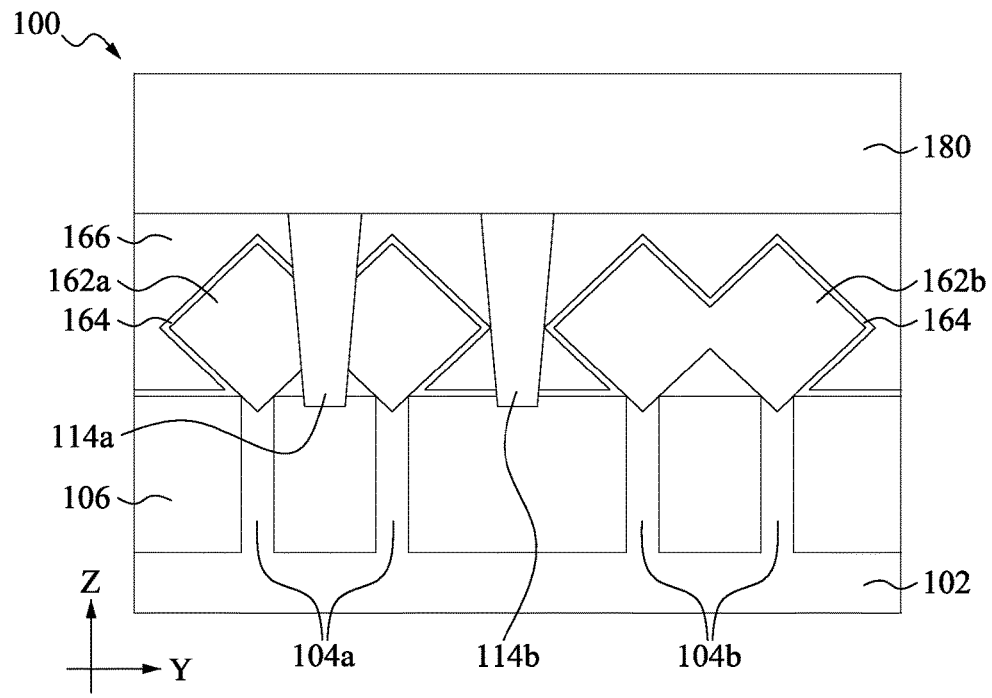

At operation 222, the method 200 (FIG. 2C) deposits a dielectric layer 180 over the device 100, such as shown in FIG. 15, which is a cross-sectional view of the device along the B-B line of FIG. 1A. In an embodiment, the dielectric layer 180 is another ILD layer and may comprise TEOS oxide, un-doped silicate glass, or doped silicon oxide such as BPSG, FSG, PSG, BSG, and/or other suitable dielectric materials. The dielectric layer 180 may be formed by PECVD, FCVD, or other suitable methods.

Figure 16:
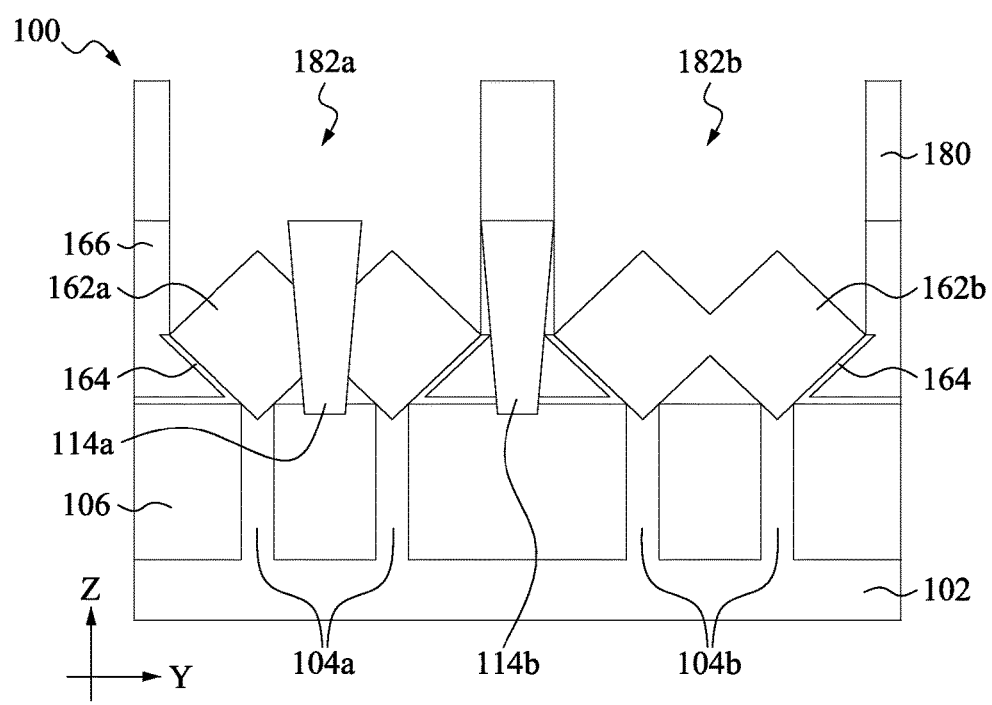

At operation 224, the method 200 (FIG. 2C) etches contact holes 182 into the device 100, including contact holes 182a exposing the S/D features 162a and contact holes 182b exposing the S/D features 162b, such as shown in FIG. 16, which is a cross-sectional view of the device along the B-B line of FIG. 1A. In an embodiment, the operation 224 includes coating a photoresist layer over the device 100, exposing and developing the photoresist layer to form openings, and etching the various layers 180, 166, and 164 through the openings to form the contact holes 182. Particularly, the etching process is tuned to selectively etch the layers 180, 166, and 164 but not the S/D features 162 and the dielectric layer 114. The etching process is dry etching in an embodiment.

Figure 17:
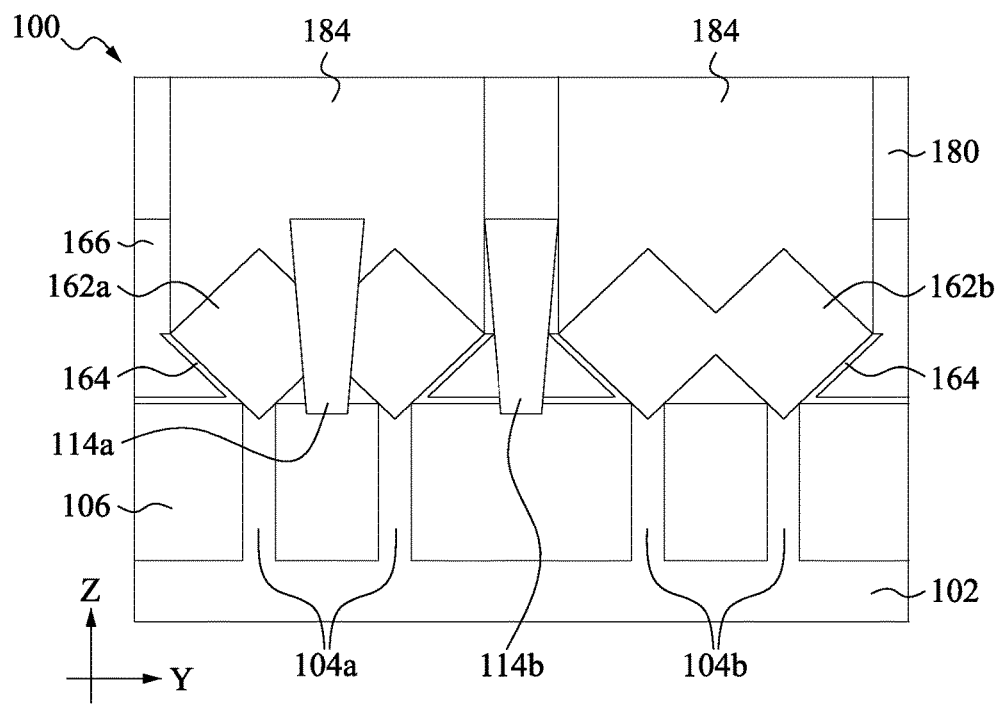

At operation 226, the method 200 (FIG. 2C) deposits one or more conductive materials 184 into the contact holes 182, such as shown in FIG. 17, which is a cross-sectional view of the device along the B-B line of FIG. 1A. In an embodiment, the method 200 may form silicide features over the exposed surfaces of the S/D features 162 before depositing the conductive materials 184. In an embodiment, the conductive materials 184 includes a barrier layer such as TaN or TiN and a metal fill layer such as Al, Cu, or W. The conductive materials 184 may be deposited using CVD, PVD, plating, or other suitable methods.

Figure 18:
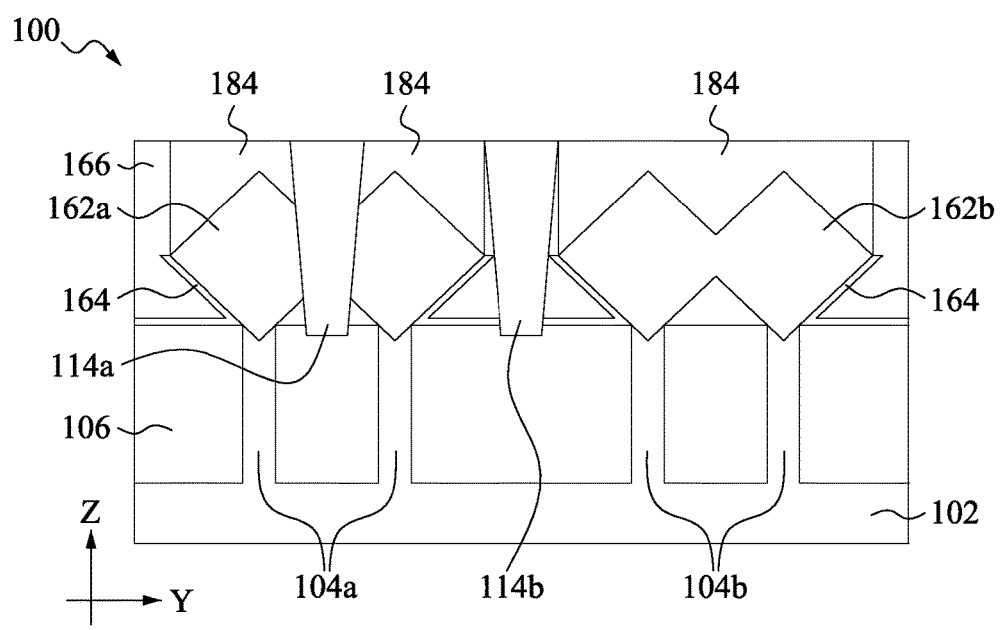

At operation 228, the method 200 (FIG. 2C) performs a CMP process to remove excessive materials 184 and to expose the dielectric layer 114, such as shown in FIG. 18, which is a cross-sectional view of the device along the B-B line of FIG. 1A. Referring to FIG. 18, in the present embodiment, the CMP process of the operation 228 separates the conductive materials 184 above the two S/D features 162a to thereby form two S/D contacts that are isolated by the dielectric feature 114a. Due to the large surface area of the S/D features 162a, each of the two S/D contacts has a sufficiently large interface with the underlying S/D feature 162a for reducing S/D contact resistance.

At operation 230, the method 200 (FIG. 2C) performs further steps to complete the fabrication of the device 100. For example, the method 200 may form metal interconnects electrically connecting the source, drain, gate terminals of various transistors to form a complete IC.

Although not intended to be limiting, one or more embodiments of the present disclosure provide many benefits to a semiconductor device and the formation thereof. For example, embodiments of the present disclosure provide a two-step cut metal gate process where the first step etches dielectric layers but not the metal gate and the second step etches the metal gate. Embodiments of the present disclosure then utilize the first etching step to separate previously merged S/D features that are designed for individual transistors. This allows semiconductor fins for individual transistors to be arranged closer in embodiments of the present disclosure than in traditional devices and the S/D features to be grown larger than traditional devices. This not only increases device integration, but also reduces S/D contact resistance.

In one exemplary aspect, the present disclosure is directed to a method. The method includes providing a structure having a substrate and first and second fins over the substrate and oriented lengthwise generally along a first direction; epitaxially growing semiconductor source/drain (S/D) features over the first and second fins, wherein a first semiconductor S/D feature over the first fin merges with a second semiconductor S/D feature over the second fin; and performing a first etching process to an area between the first and second fins, wherein the first etching process separates the first and second semiconductor S/D features.

In an embodiment, the method further includes, before the performing of the first etching process, forming gate structures over the substrate and the first and second fins, wherein the gate structures are oriented lengthwise generally along a second direction perpendicular to the first direction, wherein the first etching process is tuned to selectively etch the first and second semiconductor S/D features but not the gate structures. In a further embodiment, wherein the forming of the gate structures includes forming temporary gate structures over the substrate and the first and second fins; depositing a dielectric layer over the temporary gate structures and the semiconductor S/D features; removing the temporary gate structures, resulting in gate trenches in the dielectric layer; and depositing the gate structures in the gate trenches. In a further embodiment, the first etching process is tuned to also etch the dielectric layer. In a further embodiment, wherein the performing of the first etching process results in a trench in the dielectric layer in the area between the first and second fins, the method further includes depositing one or more dielectric materials in the trench. In a further embodiment, the method further includes etching a contact hole that exposes both the first and the second semiconductor S/D features; depositing a conductive material in the contact hole; and performing a chemical mechanical planarization (CMP) process to separate the conductive material into first and second portions, wherein the first and second portions are electrically connected to the first and second semiconductor S/D features respectively, and are isolated from each other by the one or more dielectric materials.

In another embodiment, the structure further includes a third fin over the substrate and oriented lengthwise generally along the first direction; the gate structures are also formed over the third fin; and the first etching process is also performed to an area between the second and the third fins. In a further embodiment, the method further includes performing a second etching process to the area between the second and the third fins, wherein the second etching process is tuned to etch the gate structures.

In an embodiment of the method, the first and second semiconductor S/D features include p-type doped silicon germanium. In another embodiment, wherein the performing of the first etching process results in a trench between the first and the second semiconductors S/D features, the method further includes depositing one or more dielectric materials in the trench.

In another exemplary aspect, the present disclosure is directed to a method. The method includes providing a structure having: a substrate; first, second, and third fins over the substrate and oriented lengthwise generally along a first direction; gate structures over the first, second, and third fins and oriented lengthwise generally along a second direction perpendicular to the first direction; first and second epitaxial semiconductor source/drain (S/D) features over the first and second fins respectively, wherein the first and second epitaxial semiconductor S/D features merge along the second direction; and a first dielectric layer over the substrate, the first, second, and third fins, and the first and second epitaxial semiconductor S/D features, and filling space between the gate structures. The method further includes performing a first etching process to a first area between the first and the second fins and to a second area between the second and the third fins, wherein the first etching process is tuned to selectively etch the first and second epitaxial semiconductor S/D features and the first dielectric layer but not the gate structures. The method further includes performing a second etching process to the second area, wherein the second etching process is tuned to selectively etch the gate structures.

In an embodiment of the method, the first etching process separates the first and second epitaxial semiconductor S/D features. In another embodiment, wherein the first etching process results in a first trench between the first and the second epitaxial semiconductor S/D features, the method further includes depositing one or more dielectric materials in the first trench. In a further embodiment, the first and second etching processes collectively form a second trench between the second and third fins, and the one or more dielectric materials are also deposited in the second trench.

In an embodiment of the method, the first etching process includes dry etching with an etchant having hydrogen fluoride and ammonia. In another embodiment of the method, the second etching process uses a chlorine-containing etchant.

In yet another exemplary aspect, the present disclosure is directed to a semiconductor structure. The semiconductor structure includes a substrate; first and second fins over the substrate and oriented lengthwise generally along a first direction; first and second epitaxial semiconductor source/drain (S/D) features over the first and second fins respectively; and a first dielectric layer disposed between and in physical contact with the first and the second epitaxial semiconductor S/D features, resulting in a first interface between the first dielectric layer and the first epitaxial semiconductor S/D feature, and a second interface between the first dielectric layer and the second epitaxial semiconductor S/D feature, wherein the first and second interfaces are tilted toward each other from top to bottom.

In an embodiment, the semiconductor structure further includes gate structures over the first and second fins and oriented lengthwise generally along the second direction; and a second dielectric layer over the substrate, the first and second fins, and the first and second epitaxial semiconductor S/D features, and filling space between the gate structures, wherein the first and the second dielectric layers include different dielectric materials. In a further embodiment, the semiconductor structure further includes a contact etch stop layer between the second dielectric layer and the first and second epitaxial semiconductor S/D features.

In another embodiment, the semiconductor structure further includes a first conductive feature over the first epitaxial semiconductor S/D feature; and a second conductive feature over the second epitaxial semiconductor S/D feature, wherein the first dielectric layer is disposed between the first and the second conductive features.

In an embodiment of the semiconductor structure, the first and second interfaces are two generally straight lines in a cross-sectional view cut along a second direction perpendicular to the first direction. In a further embodiment, each of the two generally straight lines forms an angle ranging from 0 to 5 degrees with normal of a top surface of the substrate.

In another embodiment of the semiconductor structure, each of the first and second epitaxial semiconductor S/D features includes p-type doped silicon germanium.

In yet another embodiment, the semiconductor structure further includes a third fin over the substrate and oriented lengthwise generally along the first direction; and a third epitaxial semiconductor S/D feature over the third fin, wherein the first dielectric layer is also disposed between the second and the third epitaxial semiconductor S/D features. In a further embodiment, the first dielectric layer is not in direct contact with the third epitaxial semiconductor S/D feature. In another further embodiment, each of the first and second epitaxial semiconductor S/D features includes p-type doped silicon germanium; and the third epitaxial semiconductor S/D feature includes n-type doped silicon.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    providing a structure having a substrate and first and second fins over the substrate and oriented lengthwise generally along a first direction;
    epitaxially growing semiconductor source/drain (S/D) features over the first and the second fins, wherein a first semiconductor S/D feature over the first fin merges with a second semiconductor S/D feature over the second fin; and
    performing a first etching process to an area between the first and the second fins, wherein the first etching process removes portions of the first and the second semiconductor S/D features and portions of a dielectric layer disposed therebetween.

2. The method of claim 1, further comprising, before the performing of the first etching process:
    forming gate structures over the substrate and the first and the second fins, wherein the gate structures are oriented lengthwise generally along a second direction perpendicular to the first direction,
    wherein the first etching process is tuned to selectively etch the first and the second semiconductor S/D features but not the gate structures.

3. The method of claim 2, wherein the forming of the gate structures includes:
    forming temporary gate structures over the substrate and the first and the second fins;
    depositing the dielectric layer over the temporary gate structures and the semiconductor S/D features;
    removing the temporary gate structures, resulting in gate trenches in the dielectric layer; and
    depositing the gate structures in the gate trenches.

4. The method of claim 3, wherein the depositing of the gate structures includes forming a high-k dielectric layer and a metal gate electrode over the high-k dielectric layer.

5. The method of claim 4, wherein the performing of the first etching process results in a trench in the dielectric layer in the area between the first and the second fins, further comprising:
depositing one or more dielectric materials in the trench.

6. The method of claim 5, further comprising:
etching a contact hole that exposes both the first and the second semiconductor S/D features;
depositing a conductive material in the contact hole; and
performing a chemical mechanical planarization (CMP) process to separate the conductive material into a first portion and a second portion, wherein the first and the second portions are electrically connected to the first and the second semiconductor S/D features, respectively, and are isolated from each other by the one or more dielectric materials.

7. The method of claim 2, wherein:
the structure further includes a third fin over the substrate and oriented lengthwise generally along the first direction;
the gate structures are also formed over the third fin; and
the first etching process is also performed to an area between the second and the third fins.

8. The method of claim 7, wherein the performing of the first etching process results in a first trench in the dielectric layer, further comprising:
performing a second etching process to the area between the second and the third fins to form a second trench, wherein the second etching process is tuned to selectively etch the gate structures but not the dielectric layer.

9. The method of claim 1, wherein the first and the second semiconductor S/D features include p-type doped silicon germanium.

10. The method of claim 8, further comprising:
depositing one or more dielectric materials in the second trench.

11. A method comprising:
providing a structure having:
a substrate;
a first fin, a second fin, and a third fin over the substrate and oriented lengthwise generally along a first direction;
metal gate structures over the first, the second, and the third fins and oriented lengthwise generally along a second direction perpendicular to the first direction, wherein each gate structure includes a high-k dielectric layer and a metal gate electrode;
first and second epitaxial semiconductor source/drain (S/D) features over the first and the second fins respectively, wherein the first and the second epitaxial semiconductor S/D features merge along the second direction; and
a first dielectric layer over the substrate, the first, the second, and the third fins, and the first and the second epitaxial semiconductor S/D features, the first dielectric layer filling space between the metal gate structures;
performing a first etching process to a first area between the first and the second fins and to a second area between the second and the third fins, wherein the first etching process is tuned to selectively etch the first and the second epitaxial semiconductor S/D features and the first dielectric layer but not the metal gate structures;
performing a second etching process to the second area, wherein the second etching process is tuned to selectively etch the metal gate structures to form a trench in the metal gate structures; and
forming a second dielectric layer in the trench.

12. The method of claim 11, wherein the first etching process removes portions of the first and the second epitaxial semiconductor S/D features and portions of the first dielectric layer disposed therebetween.

13. The method of claim 11, wherein the trench is a first trench, and wherein the first etching process results in a second trench between the first and the second epitaxial semiconductor S/D features, further comprising:
depositing one or more dielectric materials in the second trench to form a third dielectric layer, wherein the third dielectric layer is separated from the first and the second epitaxial semiconductor S/D features by two continuous interfaces.

14. The method of claim 13, wherein the first and the second etching processes collectively form a third trench between the second and the third fins, further comprising depositing the one or more dielectric materials in the third trench.

15. The method of claim 11, wherein the first etching process includes dry etching with an etchant having hydrogen fluoride and ammonia.

16. The method of claim 11, wherein the second etching process uses a chlorine-containing etchant.

17. A semiconductor structure, comprising:
a substrate;
first and second fins over the substrate and oriented lengthwise generally along a first direction, wherein bottom portions of the first and the second fins are separated by an isolation feature;
first and second epitaxial semiconductor source/drain (S/D) features over the first and second fins, respectively; and
a first dielectric layer disposed between and in physical contact with the first and the second epitaxial semiconductor S/D features, wherein the first dielectric layer is defined by a first interface between the first dielectric layer and the first epitaxial semiconductor S/D feature, and a second interface between the first dielectric layer and the second epitaxial semiconductor S/D feature, and wherein a bottom surface of the first dielectric layer is disposed below a top surface of the isolation feature.

18. The semiconductor structure of claim 17, further comprising:
gate structures over the first and second fins and oriented lengthwise generally along a second direction perpendicular to the first direction; and
a second dielectric layer over the substrate, the first and second fins, and the first and second epitaxial semiconductor S/D features, the second dielectric layer filling space between the gate structures, wherein the first and the second dielectric layers include different dielectric materials.

19. The semiconductor structure of claim 18, further comprising a contact etch stop layer between the second dielectric layer and the first and second epitaxial semiconductor S/D features.

20. The semiconductor structure of claim 17, further comprising:
a first conductive feature over the first epitaxial semiconductor S/D feature; and
a second conductive feature over the second epitaxial semiconductor S/D feature, wherein the first dielectric layer is disposed between the first and the second conductive features.

* * * * *